US010276365B2

(12) United States Patent
Nishiyama

(10) Patent No.: US 10,276,365 B2
(45) Date of Patent: Apr. 30, 2019

(54) SUBSTRATE CLEANING DEVICE, SUBSTRATE PROCESSING APPARATUS, SUBSTRATE CLEANING METHOD AND SUBSTRATE PROCESSING METHOD

(71) Applicant: SCREEN Holdings Co., Ltd., Kyoto (JP)

(72) Inventor: Koji Nishiyama, Kyoto (JP)

(73) Assignee: SCREEN Holdings Co., Ltd. (JP)

(*) Notice: Subject to any disclaimer, the term of this patent is extended or adjusted under 35 U.S.C. 154(b) by 54 days.

(21) Appl. No.: 15/398,119

(22) Filed: Jan. 4, 2017

(65) Prior Publication Data

US 2017/0221696 A1 Aug. 3, 2017

(30) Foreign Application Priority Data

Feb. 1, 2016 (JP) .................................. 2016-017464
Sep. 8, 2016 (JP) .................................. 2016-175300

(51) Int. Cl.
*H01L 21/02* (2006.01)
*B08B 1/00* (2006.01)
(Continued)

(52) U.S. Cl.
CPC ............ *H01L 21/0209* (2013.01); *B08B 1/00* (2013.01); *B08B 1/002* (2013.01); *B08B 1/02* (2013.01); *B08B 3/022* (2013.01); *B08B 7/04* (2013.01); *B08B 11/02* (2013.01); *H01L 21/67046* (2013.01); *H01L 21/67051* (2013.01); *H01L 21/68764* (2013.01)

(58) Field of Classification Search
None
See application file for complete search history.

(56) References Cited

U.S. PATENT DOCUMENTS

2006/0096048 A1  5/2006  Mikhaylichenko et al. ..... 15/77
2006/0234503 A1  10/2006  Yamada et al. ............... 438/667
(Continued)

FOREIGN PATENT DOCUMENTS

JP  2009-123800 A  6/2009
JP  2009-277870 A  11/2009
(Continued)

OTHER PUBLICATIONS

Office Action dated Apr. 11, 2018 in counterpart Taiwanese Patent Application No. 105142687.
(Continued)

*Primary Examiner* — Eric W Golightly
(74) *Attorney, Agent, or Firm* — Ostrolenk Faber LLP

(57) ABSTRACT

A substrate cleaning device includes a rotation holder and a cleaner. The rotation holder includes a rotator provided to be rotatable about a rotation axis, and a plurality of holders provided at the rotator to be capable of abutting against a plurality of portions of an outer peripheral end of a substrate and holding the substrate. The cleaner includes a cleaning tool provided to be capable of removing foreign matter on a back surface of the substrate by polishing, a mover that moves the cleaning tool while pressing the cleaning tool against the back surface of the substrate held by the plurality of holders, and a reaction force generator that generates a reaction force in the substrate against a load applied to the back surface of the substrate by the cleaning tool.

11 Claims, 19 Drawing Sheets

(51) Int. Cl.
*B08B 1/02* (2006.01)
*B08B 3/02* (2006.01)
*B08B 7/04* (2006.01)
*H01L 21/67* (2006.01)
*H01L 21/687* (2006.01)
*B08B 11/02* (2006.01)

(56) References Cited

U.S. PATENT DOCUMENTS

| | | | |
|---|---|---|---|
| 2009/0120472 A1 | 5/2009 | Nishiyama et al. | 134/157 |
| 2009/0285991 A1 | 11/2009 | Kitano et al. | 427/346 |
| 2012/0301612 A1 | 11/2012 | Kitano et al. | 427/240 |
| 2013/0255031 A1 | 10/2013 | Nishiyama | 15/383 |
| 2013/0258300 A1 | 10/2013 | Nishiyama | 355/30 |
| 2015/0133032 A1 | 5/2015 | Kubo et al. | 451/5 |
| 2017/0225289 A1 | 8/2017 | Kubo et al. | |

FOREIGN PATENT DOCUMENTS

| | | |
|---|---|---|
| KR | 10-2011-0072031 A | 6/2011 |
| KR | 10-2013-0110020 A | 10/2013 |
| KR | 10-2015-0055550 A | 5/2015 |
| TW | 200507979 A | 3/2005 |

OTHER PUBLICATIONS

Office Action dated Jan. 11, 2018 in counterpart Korean Patent Application No. 10-2017-0012491.

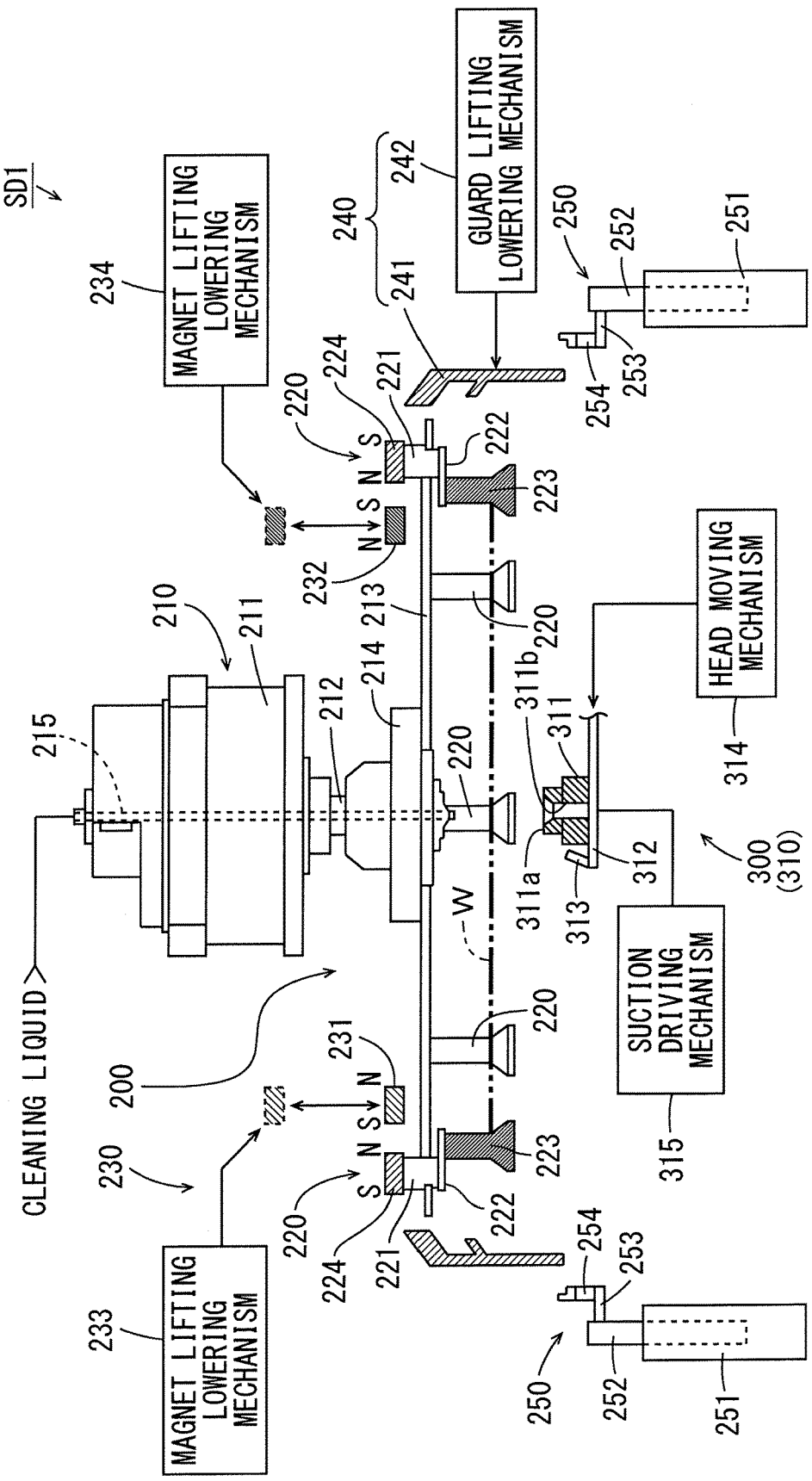

ated to a substrate cleaning device and a substrate processing apparatus that clean substrates and a substrate cleaning method and a substrate processing method for cleaning substrates.

SUBSTRATE CLEANING DEVICE, SUBSTRATE PROCESSING APPARATUS, SUBSTRATE CLEANING METHOD AND SUBSTRATE PROCESSING METHOD

BACKGROUND OF THE INVENTION

Field of the Invention

The present invention relates to a substrate cleaning device and a substrate processing apparatus that clean substrates and a substrate cleaning method and a substrate processing method for cleaning substrates.

Description of Related Art

In a lithography process in manufacturing of a semiconductor device and the like, a coating film is formed by supply of a coating liquid such as a resist liquid to an upper surface of a substrate. The coating film is exposed to exposure light and then developed, so that a predetermined pattern is formed on the coating film. Cleaning processing is performed on the substrate before the exposure of the coating film (see JP 2009-123800 A, for example).

In JP 2009-123800 A, a substrate processing apparatus having a cleaning drying processing unit is described. In the cleaning drying processing unit, the substrate is rotated while being horizontally held by a spin chuck. In this state, particles and the like adhering to a surface of the substrate are cleaned away by supply of a cleaning liquid to a surface of the substrate. Further, contaminants adhering to an entire back surface and an outer peripheral end of the substrate are removed by cleaning of the entire back surface and the outer peripheral end of the substrate by the cleaning liquid and a cleaning brush.

BRIEF SUMMARY OF THE INVENTION

In recent years, it is desired that a finer pattern is formed on the substrate. In the case where foreign matter remains on the substrate, accuracy of pattern formation is reduced. Therefore, the foreign matter that remains on the substrate is preferably and sufficiently removed. However, in the cleaning drying processing unit described in JP 2009-123800 A, it is difficult to remove foreign matter firmly adhering to the back surface of the substrate, a coating film that is formed when the coating liquid flows to the back surface of the substrate, foreign matter mixed with the coating film and the like.

An object of the present invention is to provide a substrate cleaning device and a substrate processing apparatus capable of removing foreign matter adhering to a back surface of a substrate, and a substrate cleaning method and a substrate processing method by which the foreign matter adhering to the back surface of the substrate can be removed.

One substrate cleaning device that cleans a back surface of a substrate includes a rotation holder that holds and rotates the substrate, and a cleaner that cleans the back surface of the substrate held by the rotation holder, wherein the rotation holder includes a rotator provided to be rotatable about a rotation axis, a plurality of holders provided at the rotator to be capable of abutting against a plurality of portions of an outer peripheral end of the substrate and holding the substrate, and the cleaner includes a cleaning tool provided to be capable of removing foreign matter on the back surface of the substrate by polishing, a mover that moves the cleaning tool while pressing the cleaning tool against the back surface of the substrate held by the plurality of holders, and a reaction force generator that generates a reaction force in the substrate against a load applied to the back surface of the substrate by the cleaning tool.

In this substrate cleaning device, the back surface of the substrate held and rotated by the rotation holder is cleaned by the cleaner. In the rotation holder, the outer peripheral end of the substrate is held with the plurality of holders provided at the rotator abutting against the plurality of portions of the outer peripheral end of the substrate. Further, the rotator is rotated about the rotation axis. In the cleaner, the cleaning tool is moved while being pressed by the mover against the back surface of the substrate held by the plurality of holders of the rotation holder. The reaction force against the load applied to the back surface of the substrate by the cleaning tool is generated in the substrate by the reaction force generator. Foreign matter on the back surface of the substrate is removed by polishing with the cleaning tool.

In this configuration, the load applied to the back surface of the substrate by the cleaning tool during cleaning is resisted by the reaction force generated by the reaction force generator. Therefore, even when the cleaning tool is pressed against the back surface of the substrate, the substrate is prevented from bending. Thus, the cleaning tool can uniformly abut against the back surface of the substrate, and a uniform load can be applied to the back surface of the substrate for sufficient cleaning. As a result, foreign matter firmly adhering to the back surface of the substrate, the coating film that is formed when the coating liquid flows to the back surface of the substrate, foreign matter mixed with the coating film and the like can be reliably removed.

The reaction force generator may include a plurality of abutments provided at the rotator to abut against a plurality of portions of the outer peripheral end of the substrate, and the plurality of abutments, when a load is applied to the back surface of the substrate by the cleaning tool, may generate a reaction force in the outer peripheral end of the substrate against the load. In this case, the reaction force against the load applied to the back surface of the substrate can be generated by the abutments with a simple configuration.

The outer peripheral end of the substrate may have a bevel portion close to a surface to be processed, a bevel portion close to a back surface and an end surface, and each of the plurality of abutments may have an abutment surface that abuts against a plurality of portions of the bevel portion close to the surface to be processed of the substrate. In this case, it is possible to generate a reaction force against a load applied to the back surface of the substrate by the abutments with a simple configuration without damaging the coating film formed on the surface to be processed of the substrate.

The plurality of holders may be provided to be switchable between a substrate holding state and a substrate releasing state, the substrate holding state being a state where the plurality of holders abut against the plurality of portions of the outer peripheral end of the substrate and hold the substrate and the substrate releasing state being a state where the plurality of holders are spaced apart from the plurality of portions of the outer peripheral end of the substrate, the rotation holder may further include a holder switcher that switches states of the plurality of holders between the substrate holding state and the substrate releasing state, each of the plurality of holders may pass through a first region and a second region extending along the outer peripheral end of the substrate and be rotated about the rotation axis as the rotator is rotated, during cleaning of a center region except for a peripheral portion on the back surface of the substrate, the holder switcher may bring the plurality of holders into the substrate holding state, and the mover may move the cleaning tool in the center region on the back surface of the substrate, and during cleaning of the peripheral portion on the back surface of the substrate, the holder switcher may bring a holder positioned in the first region among the plurality of holders during the rotation of the rotator into the substrate holding state and may bring a holder positioned in the second region among the plurality of holders during the rotation of the rotator into the substrate releasing state, and the mover may move the cleaning tool to a position at the peripheral portion on the back surface of the substrate and in the second region.

In this case, during the cleaning of the peripheral portion on the back surface of the substrate, the holder positioned in the second region is spaced apart from the outer peripheral end of the substrate. Thus, the cleaning tool can be arranged in the second region without interfering with the holder. As a result, the peripheral portion on the back surface of the substrate can be efficiently cleaned.

Each abutment may be arranged between each set of two adjacent holders while abutting against a portion of the outer peripheral end of the substrate. In this configuration, even in the case where the holder is spaced apart from the outer peripheral end of the substrate in the second region, the two abutments adjacent to the holder abut against portions of the outer peripheral end of the substrate. Thus, the reaction force against the load applied to the back surface of the substrate can be generated while efficiency of the cleaning of the peripheral portion on the back surface of the substrate is maintained.

The reaction force generator may include a suction configured to be capable of sucking the back surface of the substrate, and the suction, when a load is applied to the back surface of the substrate by the cleaning tool, may generate a reaction force against the load by sucking the back surface of the substrate. In this case, it is possible to generate the reaction force against the load applied to the back surface of the substrate without damaging the coating film formed on the surface to be processed of the substrate.

The cleaning tool may have a polishing surface facing the back surface of the substrate and an opening in the polishing surface, and the suction may suck the back surface of the substrate through the opening of the cleaning tool. In this case, it is possible to polish the back surface of the surface by the cleaning tool while sucking the back surface of the substrate by the cleaning tool with a simple configuration.

The suction may be configured to be capable of discharging foreign matter by sucking the foreign matter removed by the cleaning tool. In this case, work for discharging foreign matter removed from the back surface of the substrate by polishing to outside is unnecessary. Thus, efficiency of cleaning can be improved.

The cleaner may further include a cleaning brush that further cleans the back surface of the substrate, which has been cleaned or is being cleaned by the cleaning tool. In this case, different types of foreign matter adhering to the back surface of the substrate can be appropriately removed.

Another substrate cleaning device that cleans a back surface of a substrate includes a rotation holder that holds and rotates the substrate, and a cleaner that cleans the back surface of the substrate held by the rotation holder, wherein the rotation holder includes a rotator provided to be rotatable about a rotation axis, and a plurality of holders provided at the rotator to be capable of abutting against a plurality of portions of an outer peripheral end of the substrate and holding the substrate, and the cleaner includes a cleaning tool provided to be capable of removing foreign matter on the back surface of the substrate by polishing, a mover that moves the cleaning tool while pressing the cleaning tool against the back surface of the substrate held by the plurality of holders, and a cleaning brush that further cleans the back surface of the substrate, which has been cleaned or is being cleaned by the cleaning tool.

In this substrate cleaning device, the back surface of the substrate held and rotated by the rotation holder is cleaned by the cleaner. In the rotation holder, the outer peripheral end of the substrate is held with the plurality of holders provided at the rotator abutting against the plurality of the outer peripheral end of the substrate. Further, the rotator is rotated about the rotation axis. In the cleaner, the cleaning tool is moved while being pressed by the mover against the back surface of the substrate held by the plurality of holders of the rotation holder. The foreign matter on the back surface of the substrate is removed by polishing with the cleaning tool. The back surface of the substrate, which has been cleaned or is being cleaned by the cleaning tool, is further cleaned by the cleaning brush.

Thus, foreign matter firmly adhering to the back surface of the substrate, the coating film that is formed when the coating liquid flows to the back surface of the substrate, the foreign matter mixed with the coating film and the like can be removed by polishing with the cleaning tool. Further, different types of foreign matter adhering to the back surface of the substrate can be appropriately removed by the cleaning tool and the cleaning brush.

The cleaner may further include a cleaning liquid supplier that supplies a cleaning liquid to the back surface of the substrate, which has been cleaned or is being cleaned by the cleaner. In this case, the foreign matter removed from the back surface of the substrate by polishing can be discharged to outside with a simple configuration.

One substrate processing apparatus includes a film former that forms a coating film on a surface to be processed by supplying a coating liquid to the surface to be processed of a substrate, a remover that supplies a removal liquid for removing the coating film formed on a peripheral portion of the surface to be processed of the substrate by the film former to the peripheral portion of the substrate, and the above-mentioned or another substrate cleaning device that cleans a back surface of the substrate from which the coating film on the peripheral portion of the surface to be processed is removed by the remover.

In this substrate processing apparatus, the coating film is formed on the surface to be processed of the substrate by supply of the coating liquid to the surface to be processed of the substrate by the film former. Further, the coating film formed on the peripheral portion of the surface to be processed of the substrate is removed by supply of the removal liquid to the peripheral portion of the substrate by the remover. Thus, the coating film is formed on the surface to be processed except for the peripheral portion of the substrate.

In the above-mentioned substrate cleaning device, the back surface of the substrate held and rotated by the rotation holder is cleaned by the cleaner. In the rotation holder, the outer peripheral end of the substrate is held with the plurality of holders provided at the rotator abutting against the plurality of portions of the outer peripheral end of the substrate. Further, the rotator is rotated about the rotation axis. In the cleaner, the cleaning tool is moved while being pressed by the mover against the back surface of the substrate held by the plurality of holders of the rotation holder. Foreign matter on the back surface of the substrate is removed by polishing with the cleaning tool.

In the one above-mentioned substrate cleaning device, the reaction force against the load applied to the back surface of the substrate by the cleaning tool is generated in the substrate by the reaction force generator. That is, the load applied to the back surface of the substrate by the cleaning tool during cleaning is resisted by the reaction force generated by the reaction force generator. Therefore, even when the cleaning tool is pressed against the back surface of the substrate, the substrate is prevented from bending. Thus, the cleaning tool can uniformly abut against the back surface of the substrate, and a uniform load can be applied to the back surface of the substrate for sufficient cleaning. As a result, foreign matter firmly adhering to the back surface of the substrate, the coating film that is formed when the coating liquid flows to the back surface of the substrate, foreign matter mixed with the coating film and the like can be reliably removed.

In the other above-mentioned substrate cleaning device, foreign matter on the back surface of the substrate is removed by polishing with the cleaning tool, and then the back surface of the substrate is further cleaned by the cleaning brush. Thus, foreign matter firmly adhering to the back surface of the substrate, the coating film that is formed when the coating liquid flows to the back surface of the substrate, foreign matter mixed with the coating film and the like can be removed by polishing with the cleaning tool. Further, different types of foreign matter adhering to the back surface of the substrate can be appropriately removed by the cleaning tool and the cleaning brush.

One substrate cleaning method for cleaning a back surface of a substrate including the steps of holding and rotating the substrate by a rotation holder, and cleaning the back surface of the substrate held by the rotation holder by a cleaner, wherein the step of holding and rotating the substrate includes making a plurality of holders provided at a rotator abut against and hold a plurality of portions of an outer peripheral end of the substrate, and rotating the rotator about a rotation axis, and the step of cleaning includes moving a cleaning tool by a mover while pressing the cleaning tool against the back surface of the substrate held by the plurality of holders by the mover, removing foreign matter on the back surface of the substrate by polishing with the cleaning tool, and generating a reaction force in the substrate by a reaction force generator against a load applied to the back surface of the substrate by the cleaning tool.

In this substrate cleaning method, the back surface of the substrate held and rotated by the rotation holder is cleaned by the cleaner. In the rotation holder, the outer peripheral end of the substrate is held with the plurality of holders provided at the rotator abutting against the plurality of portions of the outer peripheral end of the substrate. Further, the rotator is rotated about the rotation axis. In the cleaner, the cleaning tool is moved while being pressed by the mover against the back surface of the substrate held by the plurality of holders of the rotation holder. The reaction force against the load applied to the back surface of the substrate by the cleaning tool is generated in the substrate by the reaction force generator. Foreign matter on the back surface of the substrate is removed by polishing with the cleaning tool.

In this method, the load applied to the back surface of the substrate by the cleaning tool during cleaning is resisted by the reaction force generated by the reaction force generator. Therefore, even when the cleaning tool is pressed against the back surface of the substrate, the substrate is prevented from bending. Thus, the cleaning tool can uniformly abut against the back surface of the substrate, and a uniform load can be applied to the back surface of the substrate for sufficient cleaning. As a result, foreign matter firmly adhering to the back surface of the substrate, the coating film that is formed when the coating liquid flows to the back surface of the substrate, foreign matter mixed with the coating film and the like can be reliably removed.

Another substrate cleaning method for cleaning a back surface of a substrate, including the steps of holding and rotating the substrate by a rotation holder and cleaning the back surface of the substrate held by the rotation holder by a cleaner, wherein the step of holding and rotating the substrate includes making a plurality of holders provided at a rotator abut against and hold a plurality of portions of an outer peripheral end of the substrate, and rotating the rotator about a rotation axis, and the step of cleaning includes moving a cleaning tool by a mover while pressing the cleaning tool against the back surface of the substrate held by the plurality of holders by the mover, removing foreign matter on the back surface of the substrate by polishing with the cleaning tool, and further cleaning the back surface of the substrate, which has been cleaned or is being cleaned by the cleaning tool, by a cleaning brush.

In this substrate cleaning method, the back surface of the substrate held and rotated by the rotation holder is cleaned by the cleaner. In the rotation holder, the outer peripheral end of the substrate is held with the plurality of holders provided at the rotator abutting against the plurality of portions of the outer peripheral end of the substrate. Further, the rotator is rotated about the rotation axis. In the cleaner, the cleaning tool is moved while being pressed by the mover against the back surface of the substrate held by the plurality of holders of the rotation holder. Foreign matter on the back surface of the substrate is removed by polishing with the cleaning tool. The back surface of the substrate, which has been cleaned or is being cleaned by the cleaning tool, is further cleaned by the cleaning brush.

Thus, foreign matter firmly adhering to the back surface of the substrate, the coating film that is formed when the coating liquid flows to the back surface of the substrate, foreign matter mixed with the coating film and the like can be removed by the polishing with the cleaning tool. Further, different types of foreign matter adhering to the back surface of the substrate can be appropriately removed by the cleaning tool and the cleaning brush.

One substrate processing method including the steps of forming a coating film on a surface to be processed by supplying a coating liquid to the surface to be processed of a substrate, supplying a removal liquid for removing the coating film formed on a peripheral portion of the surface to be processed of the substrate to the peripheral portion of the substrate, and cleaning a back surface of the substrate from which the coating film on the peripheral portion of the surface to be processed is removed by using the above-mentioned or another substrate cleaning method.

In this substrate processing method, the coating film is formed on the surface to be processed of the substrate by supply of the coating liquid to the surface to be processed of the substrate by the film former. Further, the coating film formed on the peripheral portion of the surface to be processed of the substrate is removed by supply of the removal liquid to the peripheral portion of the substrate by the remover. Thus, the coating film is formed on the surface to be processed except for the peripheral portion of the substrate.

In the above-mentioned substrate cleaning method, the back surface of the substrate held and rotated by the rotation holder is cleaned by the cleaner. In the rotation holder, the outer peripheral end of the substrate is held with the plurality of holders provided at the rotator abutting against the plurality of portions of the outer peripheral end of the substrate. Further, the rotator is rotated about the rotation axis. In the cleaner, the cleaning tool is moved while being pressed by the mover against the back surface of the substrate held by the plurality of holders of the rotation holder. Foreign matter on the back surface of the substrate is removed by polishing with the cleaning tool.

In the one above-mentioned substrate cleaning method, the reaction force against the load applied to the back surface of the substrate by the cleaning tool is generated in the substrate by the reaction force generator. That is, the load applied to the back surface of the substrate by the cleaning tool during cleaning is resisted by the reaction force generated by the reaction force generator. Therefore, even when the cleaning tool is pressed against the back surface of the substrate, the substrate is prevented from bending. Thus, the cleaning tool can uniformly abut against the back surface of the substrate, and a uniform load can be applied to the back surface of the substrate for sufficient cleaning. As a result, foreign matter firmly adhering to the back surface of the substrate, the coating film that is formed when the coating liquid flows to the back surface of the substrate, foreign matter mixed with the coating film and the like can be reliably removed.

In the other above-mentioned substrate cleaning method, foreign matter on the back surface of the substrate is removed by polishing with the cleaning tool, and then the back surface of the substrate is further cleaned by the cleaning brush. Thus, foreign matter firmly adhering to the back surface of the substrate, the coating film that is formed when the coating liquid flows to the back surface of the substrate, foreign matter mixed with the coating film and the like can be removed. Further, different types of foreign matter adhering to the back surface of the substrate can be appropriately removed by the cleaning tool and the cleaning brush.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 19 is a partial longitudinal cross sectional view showing a configuration of a cleaning drying processing unit in a second embodiment of the present invention;

DESCRIPTION OF THE PREFERRED EMBODIMENTS

[1] First Embodiment (1) Substrate Processing Apparatus

A substrate cleaning device and the substrate processing apparatus according to the first embodiment of the present invention will be described below with reference to drawings. In the following description, a substrate refers to a semiconductor substrate, a substrate for a liquid crystal display device, a substrate for a plasma display, a substrate for an optical disc, a substrate for a magnetic disc, a substrate for a magneto-optical disc, a substrate for a photomask or the like. Further, the substrate used in the present embodiment has an at least partially circular outer peripheral end. For example, the outer peripheral end except for a notch for positioning is circular.

Figure 1:
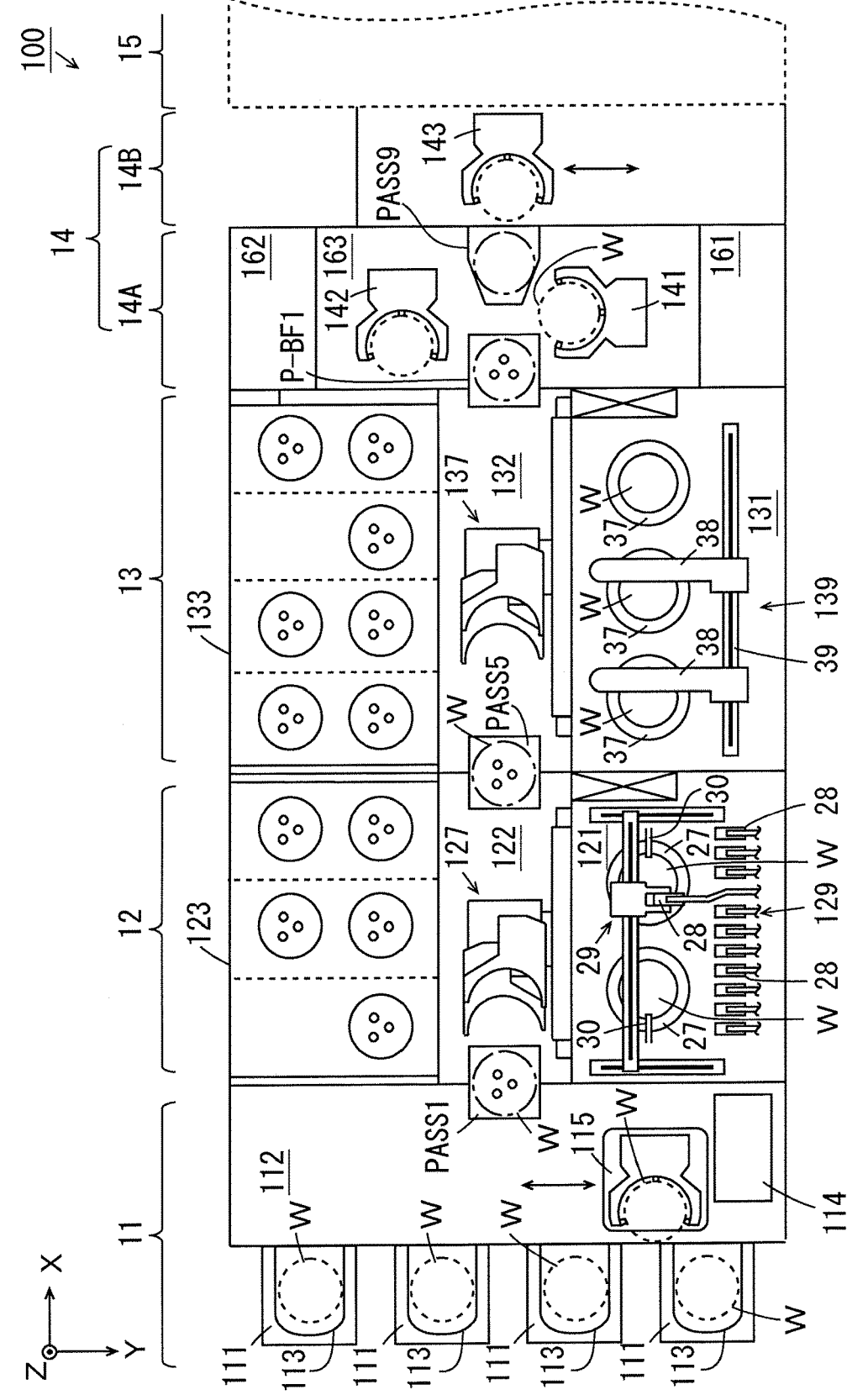
FIG. 1 is a schematic plan view of a substrate processing apparatus according to a first embodiment of the present invention.

FIG. 1 is a schematic plan view of the substrate processing apparatus according to the first embodiment of the present invention. FIG. 1 and the subsequent drawings are accompanied by arrows that indicate X, Y, and Z directions orthogonal to one another for the clarity of a positional relationship. The X and Y directions are orthogonal to each other within a horizontal plane, and the Z direction corresponds to a vertical direction.

As shown in FIG. 1, the substrate processing apparatus 100 includes an indexer block 11, a coating block 12, a development block 13, a cleaning drying processing block 14A and a carry-in carry-out block 14B. An interface block 14 is constituted by the cleaning drying processing block 14A and the carry-in carry-out block 14B. An exposure device (an exposer) 15 is arranged to be adjacent to the carry-in carry-out block 14B.

The indexer block 11 includes a plurality of carrier platforms 111 and a transport section (a transport space) 112. In each carrier platform 111, a carrier 113 for storing the plurality of substrates W in multiple stages is placed. In the transport section 112, a main controller 114 and a transport mechanism (a transport robot) 115 are provided. The main controller 114 controls various constituent elements of the substrate processing apparatus 100. The transport mechanism 115 holds and transports the substrate W.

The coating block 12 includes a coating processing section (a coating processing space) 121, a transport section (a transport space) 122 and a thermal processing section (a thermal processing space) 123. The coating processing section 121 and the thermal processing section 123 are opposite to each other with the transport section 122 sandwiched therebetween. Substrate platforms PASS1 to PASS4 (see FIG. 13) on which the substrates W are placed are provided between the transport section 122 and the indexer block 11. Transport mechanisms (transport robots) 127, 128 (see FIG. 13), which transport the substrates W, are provided in the transport section 122.

The development block 13 includes a development processing section (a development processing space) 131, a transport section (a transport space) 132 and a thermal processing section (a thermal processing space) 133. The development processing section 131 and the thermal processing section 133 are opposite to each other with the transport section 132 sandwiched therebetween. Substrate platforms PASS5 to PASS8 (see FIG. 13) on which the substrates W are placed are provided between the transport section 132 and the transport section 122. Transport mechanisms (transport robots) 137, 138 (see FIG. 13), which transport the substrates W, are provided in the transport section 132.

The cleaning drying processing block 14A includes cleaning drying processing sections (cleaning drying processing spaces) 161, 162 and a transport section (a transport space) 163. The cleaning drying processing sections 161, 162 are opposite to each other with the transport section 163 sandwiched therebetween. Transport mechanisms (transport robots) 141, 142 are provided in the transport section 163.

Placement buffer units P-BF1, P-BF2 (see FIG. 13) are provided between the transport section 163 and the transport section 132. The placement buffer units P-BF1, P-BF2 are configured to be capable of storing the plurality of substrates W.

Further, a substrate platform PASS9, and placement cooling units P-CP (see FIG. 13) that are described below are provided to be adjacent to the carry-in carry-out block 14B between the transport mechanisms 141, 142. Each placement cooling unit P-CP includes a function of cooling the substrate W (a cooling plate, for example). In the placement cooling unit P-CP, the substrate W is cooled to a temperature suitable for exposure processing. A transport mechanism (a transport robot) 143 is provided in the carry-in carry-out block 14B. The transport mechanism 143 carries in the substrate W to and carries out the substrate W from the exposure device 15.

(2) Coating Processing Section and Development Processing Section

Figure 2:
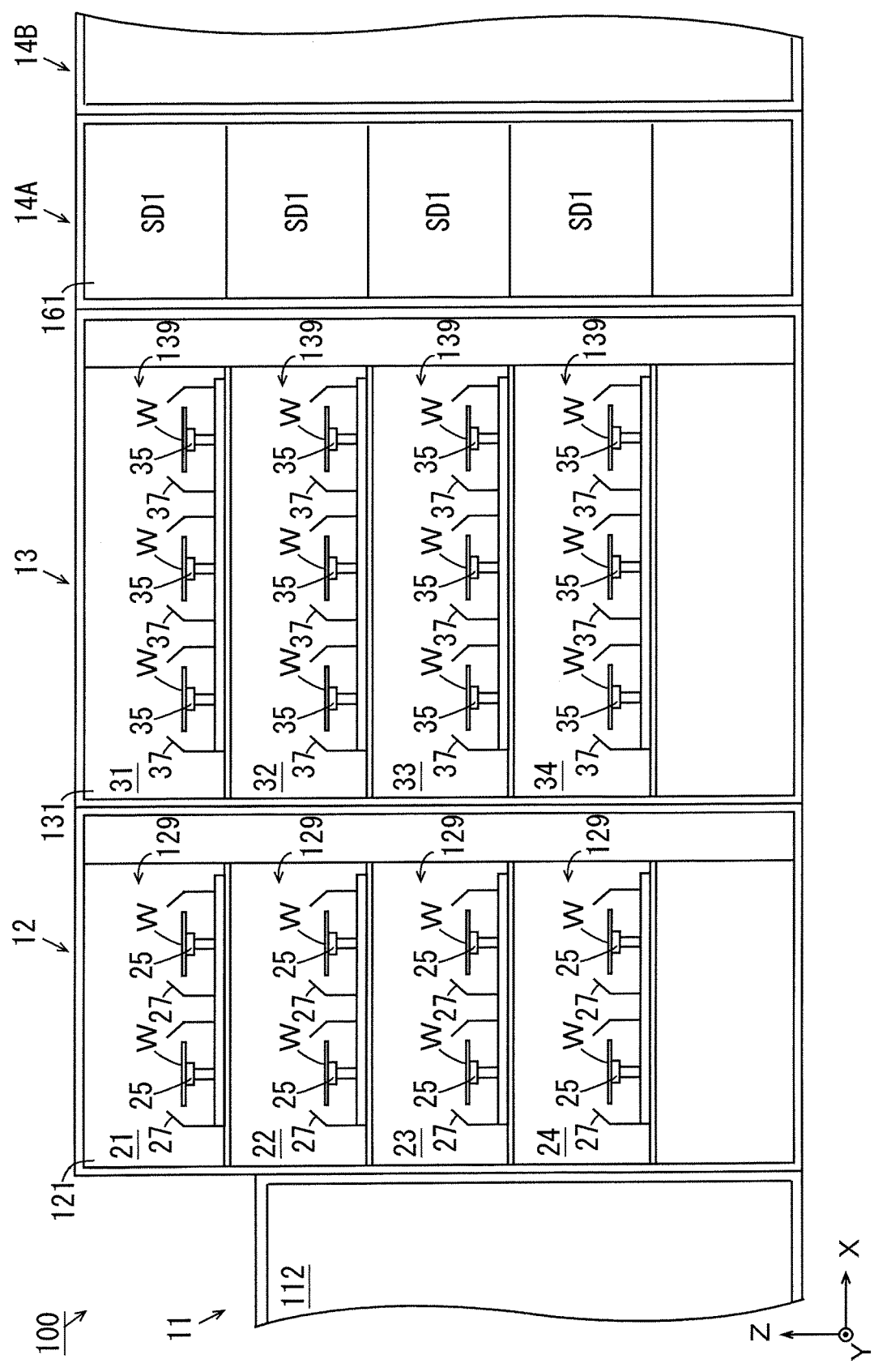
FIG. 2 is a schematic side view showing inner configurations of a coating processing section, a development processing section and a cleaning drying processing section of FIG. 1.

FIG. 2 is a schematic side view showing an inner configuration of the coating processing section 121, the development processing section 131 and the cleaning drying processing section 161 of FIG. 1. As shown in FIG. 2, in the coating processing section 121, coating processing chambers 21, 22, 23, 24 are provided in a stack. In each of the coating processing chambers 21 to 24, a coating processing unit (a coater) 129 is provided. In the development processing section 131, development processing chambers 31, 32, 33, 34 are provided in a stack. In each of the development processing chambers 31 to 34, a development processing unit (a developer) 139 is provided.

As shown in FIGS. 1 and 2, each coating processing unit 129 includes a plurality of spin chucks 25, a plurality of cups 27, a plurality of processing liquid nozzles 28, a nozzle transport mechanism (a nozzle transport robot) 29 and a plurality of edge rinse nozzles 30. In the present embodiment, two spin chucks 25, two cups 27, two edge rinse nozzles 30 are provided in each coating processing unit 129.

Each spin chuck 25 is driven to be rotated by a driving device (not shown) (an electrical motor, for example) while holding the substrate W. Each cup 27 is provided to surround the spin chuck 25.

Various types of processing liquids, described below, are supplied to each processing liquid nozzle 28 from a processing liquid storage (not shown) through a processing liquid pipe. During the wait during which the processing liquid is not supplied to the substrate W, each processing liquid nozzle 28 is arranged at a waiting position. During the supply of the processing liquid to the substrate W, any processing liquid nozzle 28 arranged at the waiting position is held by the nozzle transport mechanism 29 and transported to a position directly upward of the substrate W.

The processing liquid is discharged from the processing liquid nozzle 28 while the spin chuck 25 is rotated, whereby the processing liquid is applied to an upper surface of the rotating substrate W. Further, a rinse liquid is discharged towards a peripheral portion of the rotating substrate W from the edge rinse nozzle 30 while the spin chuck 25 is rotated, whereby a peripheral portion of the processing liquid applied to the substrate W is dissolved. Thus, the processing liquid on the peripheral portion of the substrate W is removed. The peripheral portion of the substrate W here refers to a region having a constant width extending along an outer peripheral end of the substrate W on the surface of the substrate W.

In the present embodiment, in the coating processing unit 129 in each of the coating processing chambers 22, 24 of FIG. 2, a processing liquid for an anti-reflection film (an anti-reflection liquid) is supplied to the substrate W from the processing liquid nozzle 28. In the coating processing unit 129 in each of the coating processing chambers 21, 23, a processing liquid for a resist film (a resist liquid) is supplied to the substrate W from the processing liquid nozzle 28.

As shown in FIG. 2, the development processing unit 139 includes a plurality of spin chucks 35 and a plurality of cups 37 similarly to the coating processing unit 129. Further, as shown in FIG. 1, the development processing unit 139 includes two slit nozzles 38 that discharge a development liquid and a moving mechanism (a moving robot) 39 that moves these slit nozzles 38 in the X direction.

In the development processing unit 139, each spin chuck 35 is rotated by a driving device (not shown). Thus, the substrate W is rotated. Each slit nozzle 38 supplies the development liquid to each rotating substrate W while moving. Thus, development processing for the substrate W is performed.

A plurality (four in the present example) of cleaning drying processing units (cleaning drying processors) SD1 are provided in the cleaning drying processing section 161. In each cleaning drying processing unit SD1, cleaning and drying processing for the substrate W before the exposure processing are performed. The configuration of the cleaning drying processing unit SD1 will be described below.

(3) Configuration of Cleaning Drying Processing Units

Figure 3:
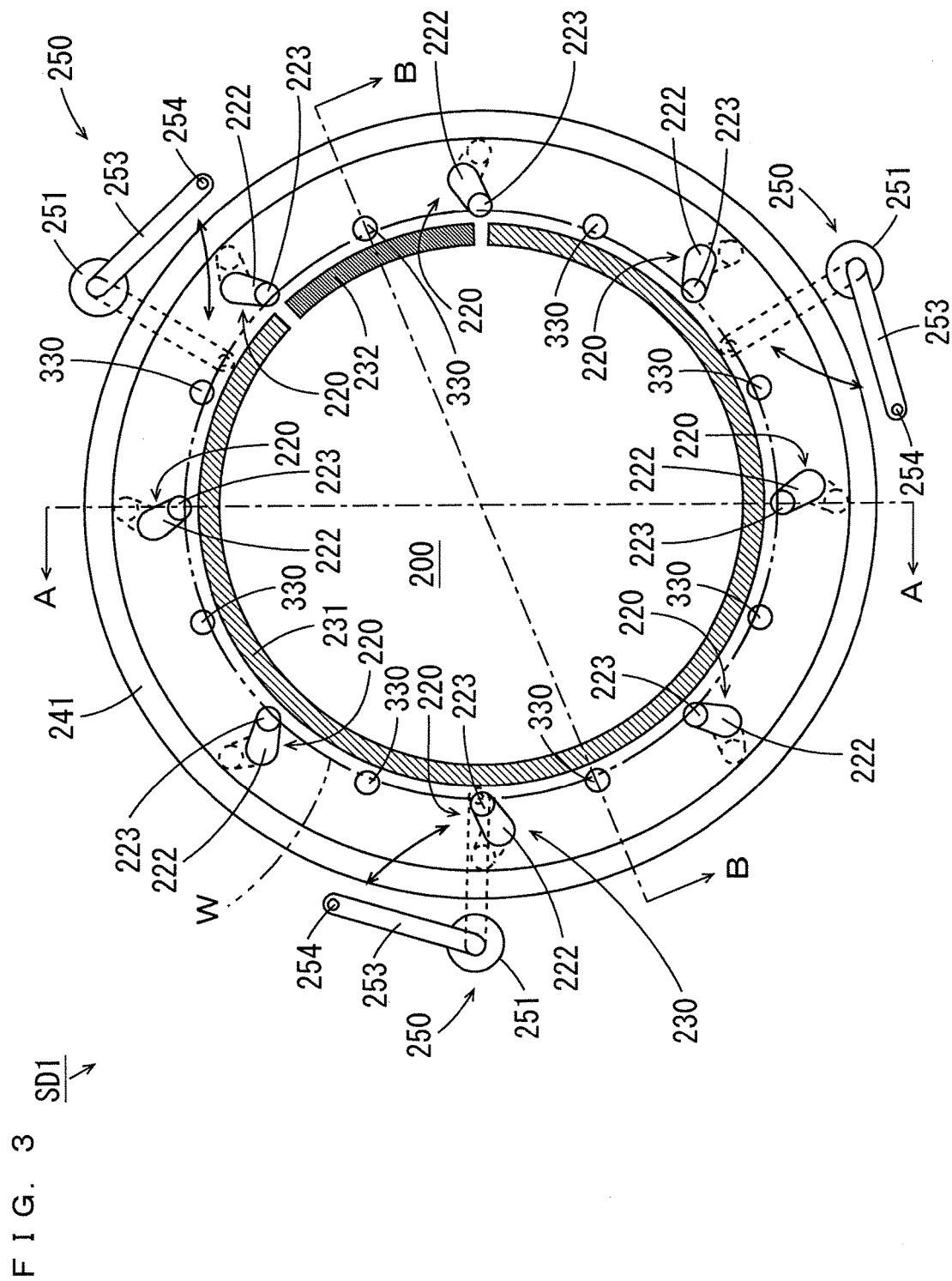
FIG. 3 is a schematic plan view showing a configuration of a cleaning drying processing unit of FIG. 2.
Figure 4:
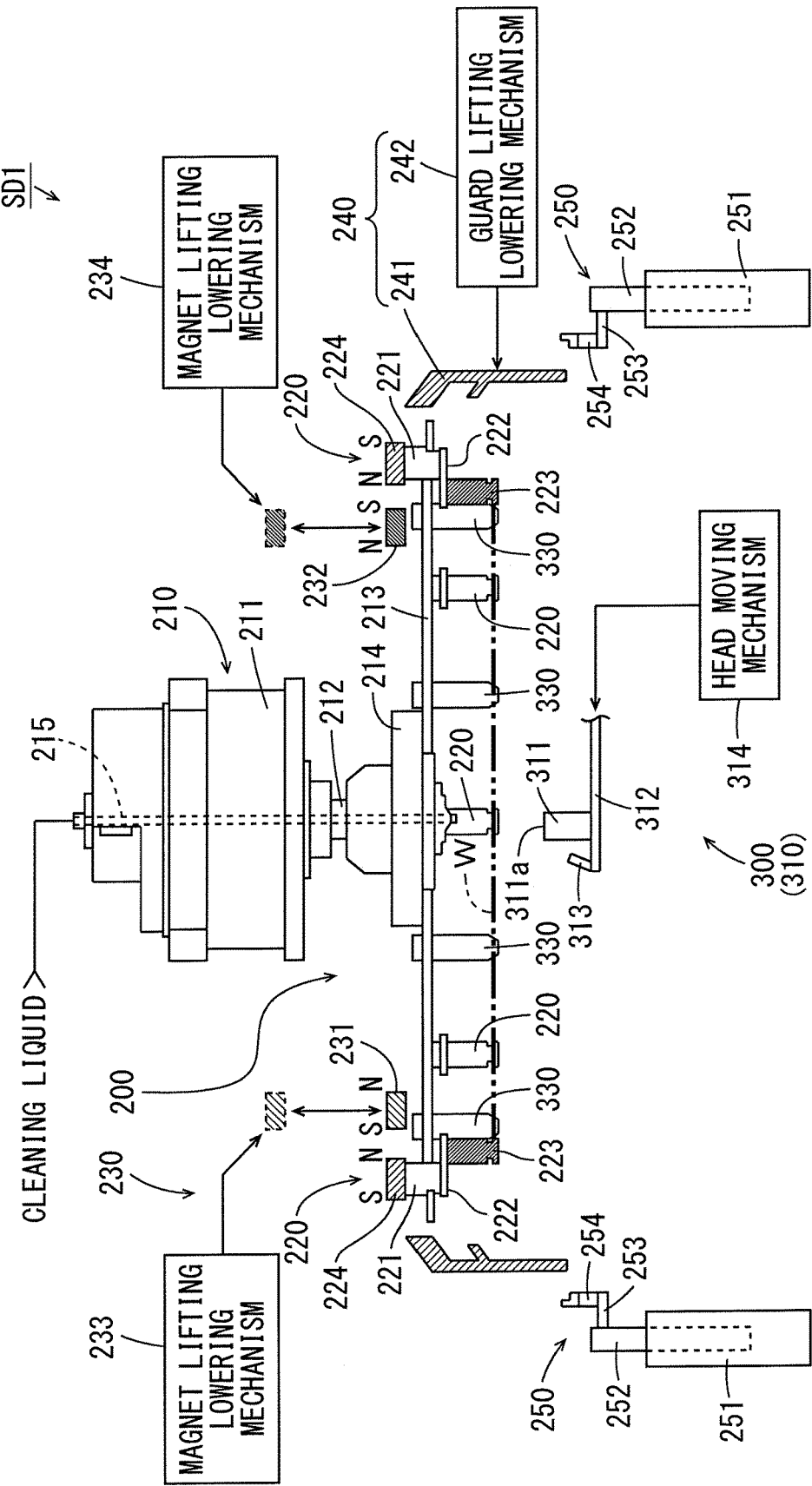
FIG. 4 is a partial cross sectional view taken along the line A-A of the cleaning drying processing unit of FIG. 3.
Figure 5:
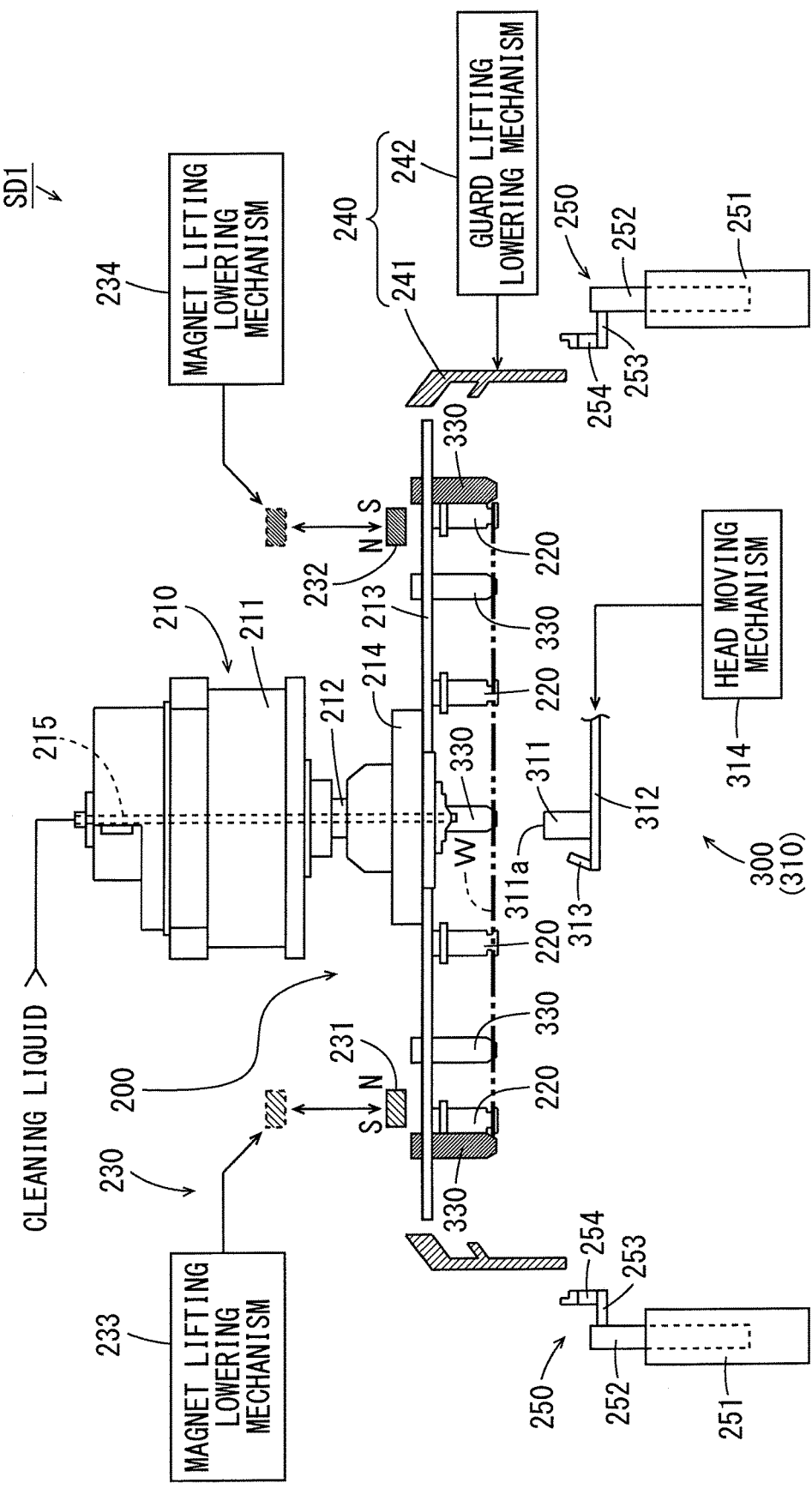
FIG. 5 is a partial cross sectional view taken along the line B-B of the cleaning drying processing unit of FIG. 3.
Figure 6A:
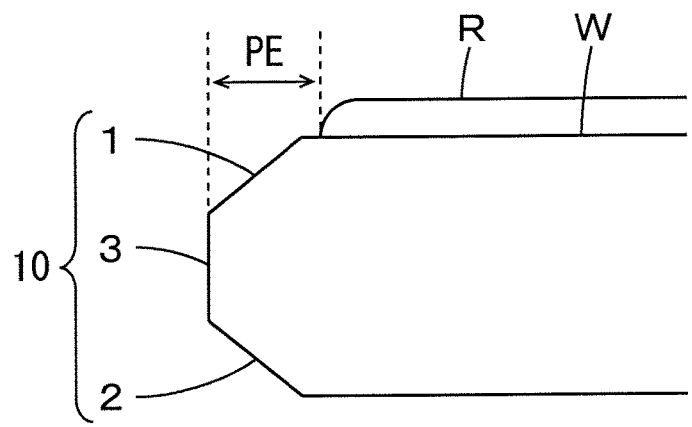
FIGS. 6A and 6B are enlarged side views of an outer peripheral end of a substrate.
Figure 6B:
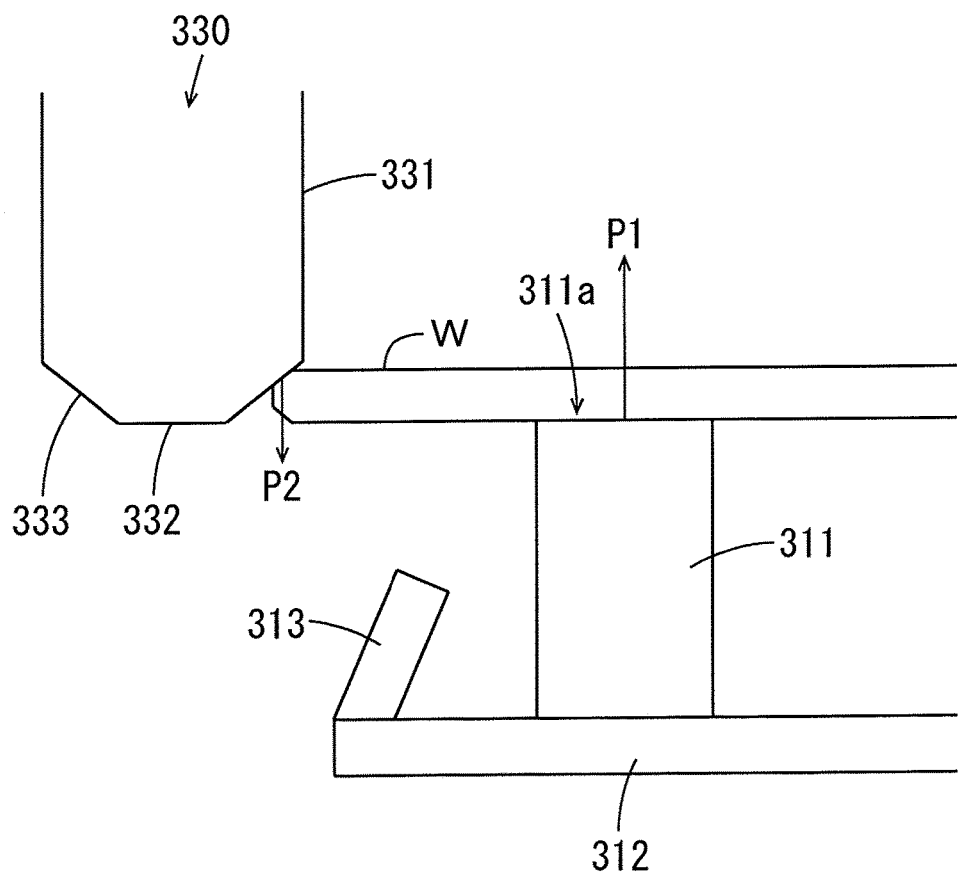

FIG. 3 is a schematic plan view showing the configuration of the cleaning drying processing unit SD1 of FIG. 2. FIG. 4 is a partial cross sectional view taken along the line A-A of the cleaning drying processing unit SD1 of FIG. 3. FIG. 5 is a partial cross sectional view taken along the line B-B of the cleaning drying processing unit SD1 of FIG. 3. FIGS. 6A and 6B are enlarged side views of the outer peripheral end of the substrate W. As shown in FIG. 6A, the outer peripheral end 10 of the substrate W includes a bevel portion 1 closer to a surface to be processed, a bevel portion 2 closer to a back surface and an end surface 3. A resist film R is formed as a coating film in a region except for a peripheral portion PE on the surface to be processed of the substrate W.

As shown in FIGS. 3 to 5, the cleaning drying processing unit SD1 includes a rotation holding unit (a rotation holder) 200 and a cleaning unit (a cleaner) 300. The rotation holding unit 200 includes a spin chuck 210, a plurality of chuck pins 220, a switcher 230, a guard mechanism 240 and a plurality of receiving transferring mechanisms 250. The spin chuck 210 is configured to horizontally hold and rotate the substrate W and includes a spin motor 211, a rotation shaft 212, a spin plate 213 and a plate support member (a plate supporter) 214.

The spin motor 211 is provided in an upper portion of the cleaning drying processing unit SD1 and supported by a support member (not shown). The rotation shaft 212 is provided to extend downward from the spin motor 211. The plate support member 214 is attached to the lower end of the rotation shaft 212. The spin plate 213 is disc-shaped and horizontally supported by the plate support member 214. The spin plate 213 is rotated about a vertical axis by rotation of the rotation shaft 212 by the spin motor 211.

A liquid supply pipe 215 is inserted into the spin motor 211, the rotation shaft 212 and the plate support member 214. A cleaning liquid can be supplied to an upper surface of the substrate W held by the spin chuck 210 through the liquid supply pipe 215. As the cleaning liquid, pure water is used, for example.

The plurality of chuck pins 220 are provided at the peripheral portion of the spin plate 213 at equal angular intervals about the rotation shaft 212. In the present example, eight chuck pins 220 are provided at the peripheral portion of the spin plate 213 at intervals of 45 degrees with respect to the rotation shaft 212. Each chuck pin 220 includes a shaft 221, a pin supporter 222, a holder 223 and a magnet 224.

The shaft 221 is provided to penetrate the spin plate 213 in a vertical direction. The pin supporter 222 is provided to extend in a horizontal direction from the lower end of the shaft 221. The holder 223 is provided to project downward from the tip end of the pin supporter 222. Further, the magnet 224 is attached to the upper end of the shaft 221 on the upper surface side of the spin plate 213.

Each chuck pin 220 is rotatable about the shaft 221 and switchable between a closed state where the holder 223 abuts against the outer peripheral end 10 of the substrate W and an open state where the holder 223 is spaced apart from the outer peripheral end 10 of the substrate W. In the present example, each chuck pin 220 is in the closed state in the case where an N pole of the magnet 224 is on an inner side, and each chuck pin 220 is in the open state in the case where an S pole of the magnet 224 is on the inner side. Further, in the closed state, each holder 223 abuts against the bevel portions 1, 2 of the substrate W.

The switcher 230 includes magnet plates 231, 232 and magnet lifting lowering mechanisms (magnet movers) 233, 234. The magnet plates 231, 232 are arranged above the spin plate 213 in a circumferential direction about the rotation shaft 212. The magnet plates 231, 232 have S poles on the outer side and N poles on the inner side. The magnet lifting lowering mechanisms 233, 234 respectively lift and lower the magnet plates 231, 232. Thus, each of the magnet plates 231, 232 is independently movable between an upper position higher than the magnet 224 of the chuck pin 220 and a lower position substantially the same height as that of the magnet 224 of the chuck pin 220.

Each chuck pin 220 is switched between the open state and the closed state by lifting and lowering of the magnet plates 231, 232. Details of operations of the magnet plates 231, 232 and the chuck pins 220 will be described below.

The guard mechanism 240 includes a guard 241 and a guard lifting lowering mechanism (a guard mover) 242. The guard 241 is rotationally symmetric about the rotation shaft 212 of the spin chuck 210 and provided outside of the spin chuck 210. The guard lifting lowering mechanism 242 lifts and lowers the guard 241. The guard 241 receives a cleaning liquid splashed from the substrate W. The cleaning liquid received by the guard 241 is discharged or recovered by a liquid discharge device or a recovery device (not shown).

The plurality (three in the present example) of receiving transferring mechanisms 250 are arranged outside of the guard 241 at equal angular intervals about the rotation shaft 212 of the spin chuck 210. Each receiving transferring mechanism 250 includes a lifting lowering rotation driver 251, a rotation shaft 252, an arm 253 and a holding pin 254.

The rotation shaft 252 is provided to extend upward from the lifting lowering rotation driver 251. The arm 253 is provided to extend in the horizontal direction from the upper end of the rotation shaft 252. The holding pin 254 is provided at a tip end of the arm 253 to be capable of holding the outer peripheral end 10 of the substrate W. The rotation shaft 252 performs a lifting lowering operation and a rotating operation by the lifting lowering rotation driver 251. Thus, the holding pin 254 is moved in the horizontal and upward-and-downward directions.

The cleaning unit 300 includes a first cleaning mechanism (a first cleaner) 310 and a plurality of auxiliary pins 330. In the present embodiment, the first cleaning mechanism 310 is arranged in a lower portion of the cleaning drying processing unit SD1 to be capable of cleaning the back surface of the substrate W held by the spin chuck 210 of the rotation holding unit 200. The first cleaning mechanism 310 includes a cleaning head 311, a head holding member (a head holder) 312, a cleaning nozzle 313 and a head moving mechanism (a head mover) 314.

The cleaning head 311 is substantially columnar and formed of a PVA (polyvinyl alcohol) sponge in which abrasive grains are dispersed, for example. The cleaning head 311 has a polishing surface 311a for polishing the back surface of the substrate W, and is held by the head holding member 312 such that the polishing surface 311a is directed upward. Further, the cleaning nozzle 313 is attached to a portion of the head holding member 312 in the vicinity of the cleaning head 311. A liquid supply pipe (not shown) from which a cleaning liquid is supplied is connected to the cleaning nozzle 313. The cleaning liquid is pure water, for example. A discharge port of the cleaning nozzle 313 is directed towards surroundings of the polishing surface 311a of the cleaning head 311.

The head moving mechanism 314 moves the head holding member 312 while applying a load P1 (FIG. 6B) to the back surface of the substrate W by the polishing surface 311a of the cleaning head 311. Thus, the cleaning head 311 is moved in the horizontal and vertical directions. The cleaning head 311 cleans by polishing the back surface of the substrate W held by the spin chuck 210. After the cleaning of the substrate W, the cleaning liquid is discharged towards surroundings of the upper end of the cleaning head 311 from the discharge port of the cleaning nozzle 313, so that particles are removed.

The plurality of auxiliary pins 330 are provided at a peripheral portion of the spin plate 213 at equal angular intervals about the rotation shaft 212 of the rotation holding unit 200. In the present example, eight auxiliary pins 330 are arranged at the peripheral portion of the spin plate 213 at intervals of 45 degrees about the rotation shaft 212. Each auxiliary pin 330 is arranged at a halfway position between the adjacent two chuck pins 220 to penetrate the spin plate 213 in the vertical direction. With each chuck pin 220 in the closed state and each holder 223 abutting against the bevel portions 1, 2 of the substrate W (FIG. 6A), a lower portion of each auxiliary pin 330 abuts against the bevel portion 1 of the substrate W.

Specifically, as shown in FIG. 6B, the auxiliary pin 330 includes an outer peripheral surface 331, a lower surface 332 and an inclined surface 333. The outer peripheral surface 331 is columnar, and the lower surface 332 is horizontal. The inclined surface 333 is formed in a tapered shape to connect the outer peripheral surface 331 and the lower surface 332 to each other. That is, the lower portion of the auxiliary pin 330 has a truncated cone-shape. The inclined surface 333 of the auxiliary pin 330 abuts against the bevel portion 1 of the substrate W. The auxiliary pin 330 generates a reaction force P2 in the substrate W against the load P1 applied to the back surface of the substrate W by the polishing surface 311a of the cleaning head 311.

While the auxiliary pin 330 abuts against the bevel portion 1 of the substrate W with the lower surface 332 not projecting downward of the substrate W in the present embodiment, the present invention is not limited to this. The auxiliary pin 330 may abut against the bevel portion 1 of the substrate W with the lower surface 332 projecting downward of the substrate W. In this case, an angle formed by the inclined surface 333 of the auxiliary pin 330 with a horizontal plane is preferably smaller than 45 degrees, for example. In this configuration, because the lower surface 332 of the auxiliary pin 330 is sufficiently spaced apart from the outer peripheral end 10 of the substrate W, the polishing surface 311a of the cleaning head 311 is unlikely to come into contact with the lower surface 332 of the auxiliary pin 330.

(4) Operation of Cleaning Drying Processing Units

Figure 7A:
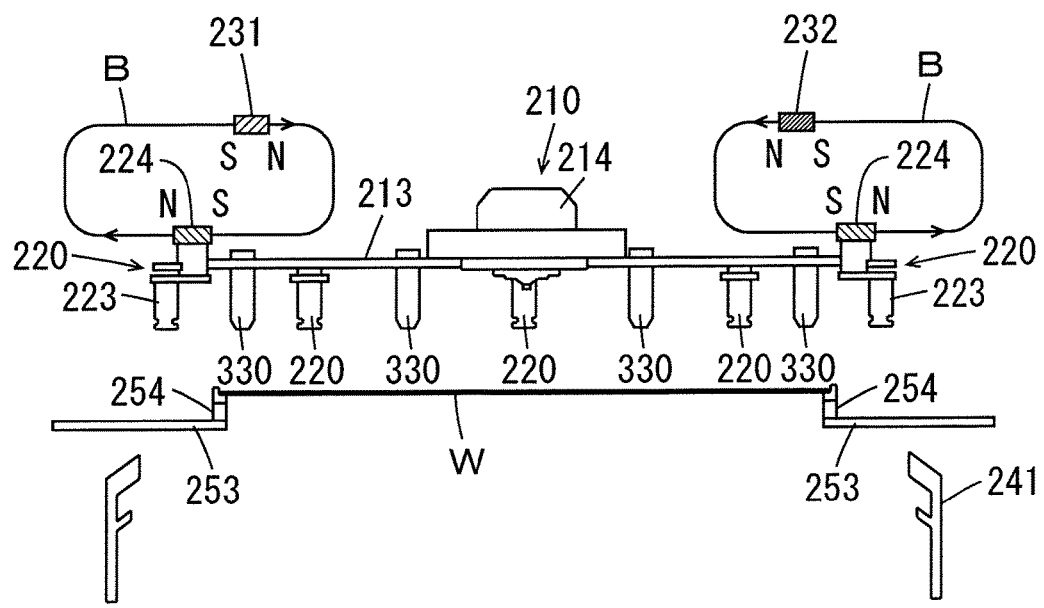
FIGS. 7A and 7B are diagrams for explaining a holding operation of the substrate by a spin chuck.

FIGS. 7A to 8B are diagrams for explaining a holding operation of the substrate W by the spin chuck 210. First, as shown in FIG. 7A, the guard 241 is moved to a position lower than the chuck pins 220. Then, the holding pins 254 of the plurality of receiving transferring mechanisms 250 (FIG. 3) are moved to positions below the spin plate 213 through a space above the guard 241. The substrate W is placed on the plurality of holding pins 254 by the transport mechanism 141 (FIG. 1).

At this time, the magnet plates 231, 232 are at the upper positions. In this case, lines of the magnetic force B of the magnet plates 231, 232 are directed outward at the height of the magnet 224 of the chuck pin 220. Thus, the S pole of the magnet 224 of each chuck pin 220 is attracted inward. Therefore, each chuck pin 220 enters the open state.

Figure 7B:
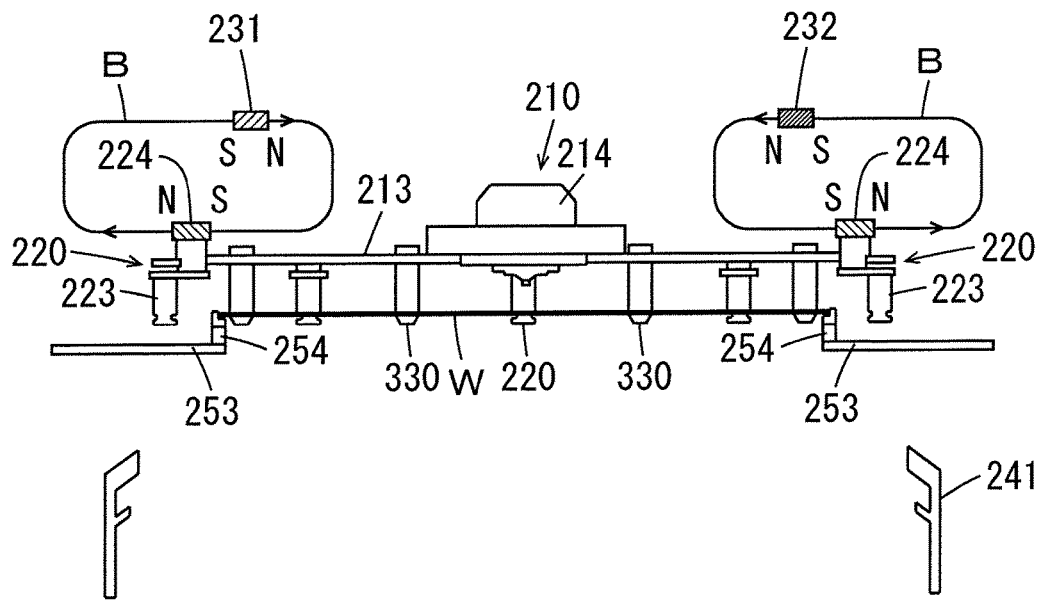

Next, as shown in FIG. 7B, the plurality of holding pins 254 are lifted while holding the substrate W. Thus, the substrate W is moved to a position surrounded by the holders 223 of the plurality of chuck pins 220. Further, the bevel portion 1 of the substrate W (FIG. 6A) abuts against the inclined surfaces 333 of the plurality of auxiliary pins 330 (FIG. 6B).

Figure 8A:
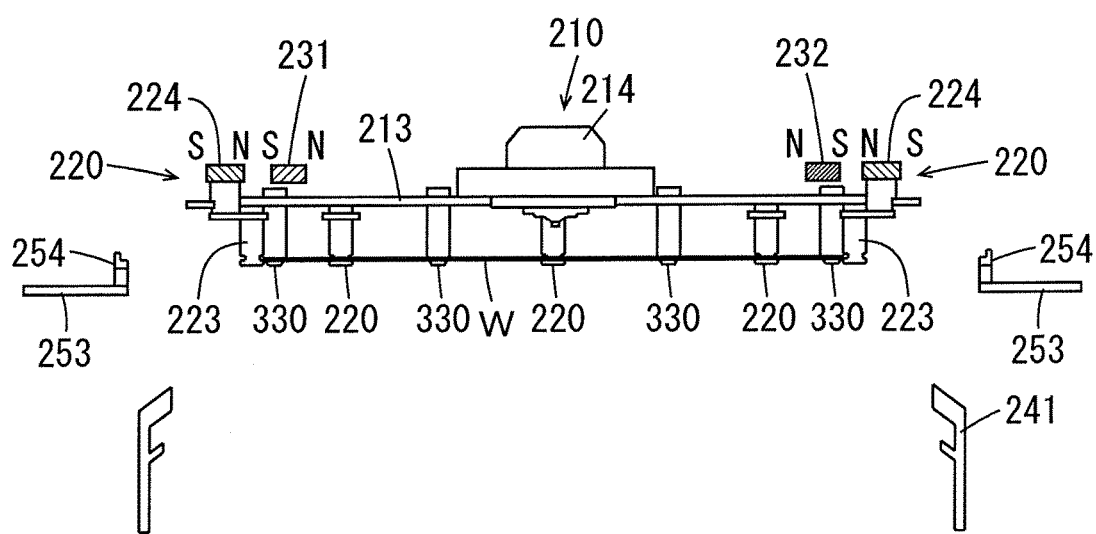
FIGS. 8A and 8B are diagrams for explaining the holding operation by the spin chuck.

Subsequently, as shown in FIG. 8A, the magnet plates 231, 232 are moved to the lower positions. In this case, the N pole of the magnet 224 of each chuck pin 220 is attracted inward, and each chuck pin 220 enters the closed state. Thus, with the bevel portion 1 of the substrate W abutting against the inclined surfaces 333 of the plurality of auxiliary pins 330, the bevel portions 1, 2 of the substrate W are held by the holder 223 of each chuck pin 220. Each chuck pin 220 holds the bevel portions 1, 2 of the substrate W between the adjacent holding pins 254. Therefore, the chuck pins 220 and the holding pins 254 do not interfere with each other. Thereafter, the plurality of holding pins 254 are moved to positions outside of the guard 241.

Figure 8B:
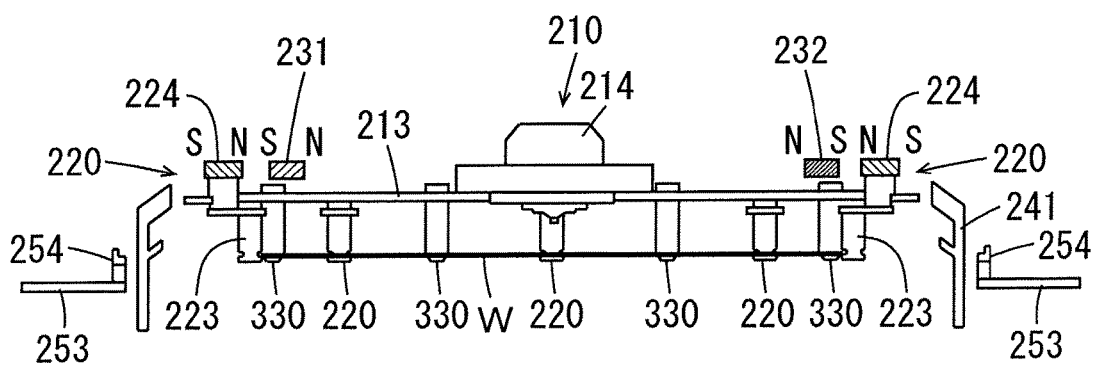

Thereafter, as shown in FIG. 8B, the guard 241 is moved to a height at which the guard 241 surrounds the substrate W held by the chuck pins 220. Then, cleaning processing and drying processing for the substrate W are sequentially performed. The cleaning processing includes surface cleaning processing for cleaning a surface (an upper surface) of the substrate W and back surface cleaning processing for cleaning the back surface (a lower surface) of the substrate W. Either of the surface cleaning processing and the back surface cleaning processing may be performed first, or the surface cleaning processing and the back surface cleaning processing may be performed simultaneously.

Figure 9:
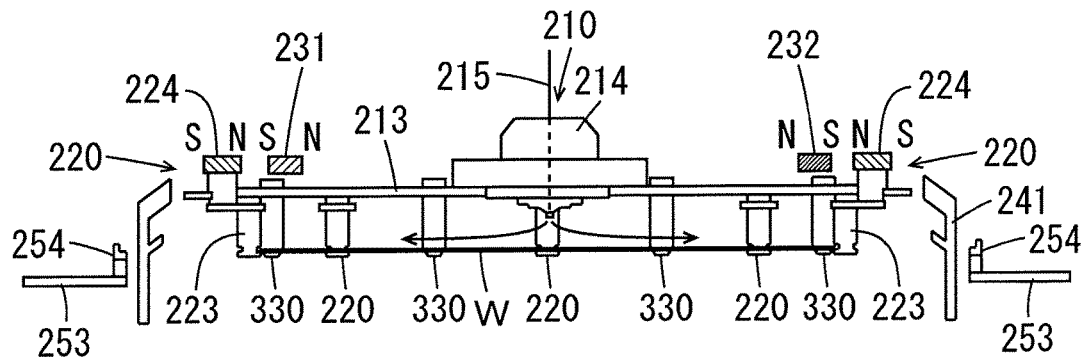
FIG. 9 is a side view for explaining surface cleaning processing for the substrate.

FIG. 9 is a side view for explaining the surface cleaning processing for the substrate W. As shown in FIG. 9, during the surface cleaning processing for the substrate W, with the substrate W rotated by the spin chuck 210, the cleaning liquid is supplied to the surface of the substrate W through the liquid supply pipe 215. The cleaning liquid spreads to the entire surface of the substrate W by a centrifugal force and is splashed outward. Thus, particles and the like adhering to the surface of the substrate W are cleaned away.

Figure 10A:
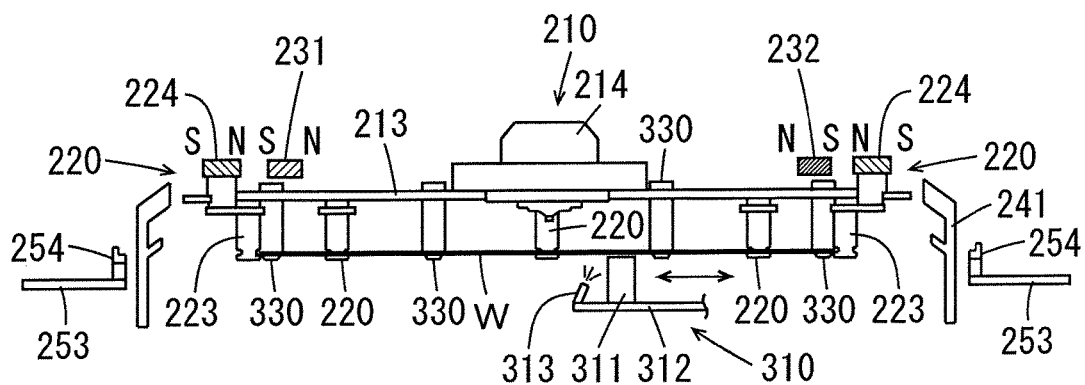
FIGS. 10A and 10B are side views for explaining back surface cleaning processing for the substrate by a first cleaning mechanism.
Figure 10B:
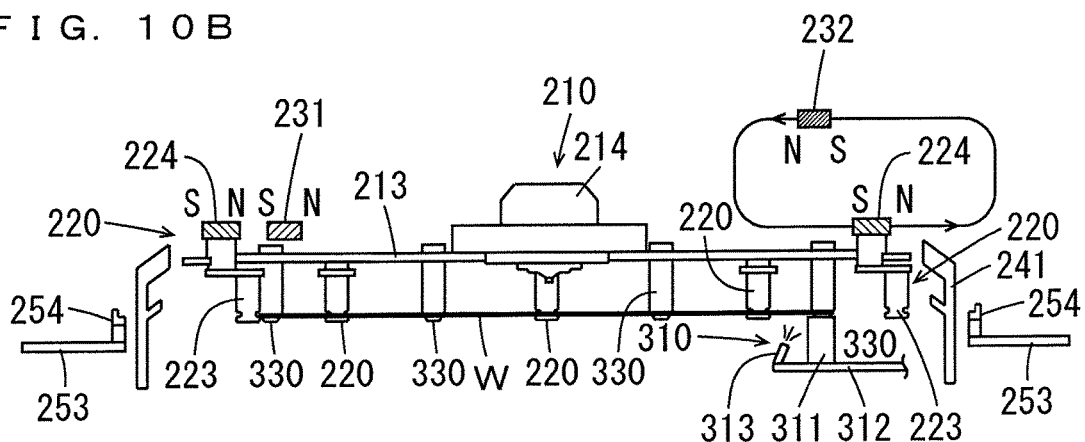
Figure 11:
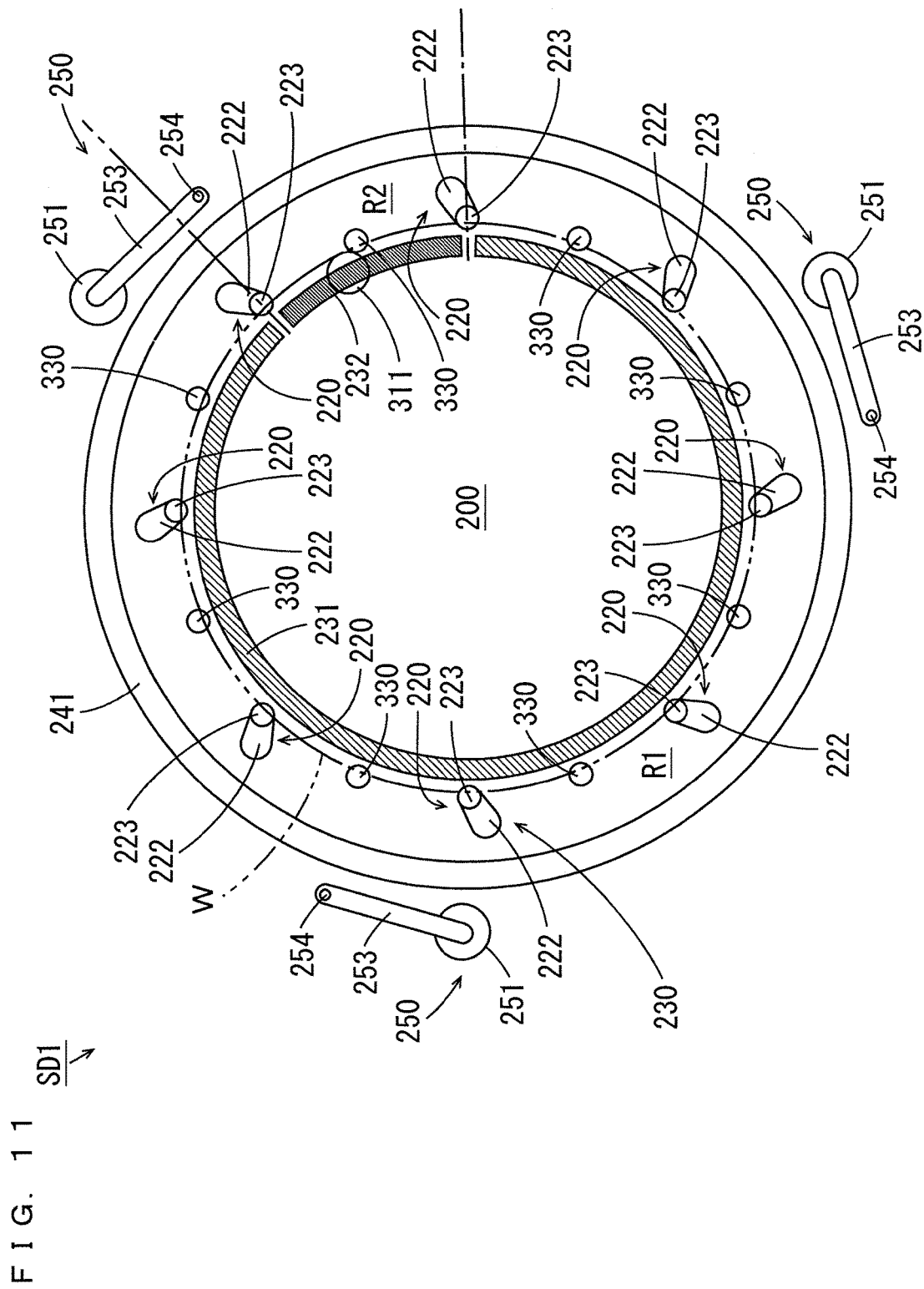
FIG. 11 is a plan view for explaining the back surface cleaning processing for the substrate by the first cleaning mechanism.

FIGS. 10A and 10B are side views for explaining the back surface cleaning processing for the substrate W by the first cleaning mechanism 310. FIG. 11 is a plan view for explaining the back surface cleaning processing for the substrate W by the first cleaning mechanism 310. In the back surface cleaning processing for the substrate W, the back surface cleaning processing for the center portion of the substrate W and the back surface cleaning processing for the peripheral portion of the substrate W are sequentially performed. The peripheral portion of the back surface of the substrate W here means a region that extends inward by a predetermined width from the bevel portion 2 of the substrate W (FIG. 6A), and its width is smaller than a diameter of the polishing surface 311a of the cleaning head 311 (FIG. 6B). Either of the back surface cleaning processing for the center portion and the back surface cleaning processing for the peripheral portion of the substrate W may be performed first.

As shown in FIG. 10A, during the back surface cleaning processing for the center portion of the substrate W, with the substrate W rotated by the spin chuck 210, the cleaning head 311 is moved to a position directly downward of the center portion of the substrate W. Then, with the load P1 applied to the back surface of the substrate W by the polishing surface 311a of the cleaning head 311, the cleaning head 311 is moved in the center portion of the substrate W. Thus, the center portion of the back surface of the substrate W is polished by the cleaning head 311, and foreign matter adhering to the back surface of the substrate W is removed. Further, the cleaning liquid is supplied to a contact portion between the back surface of the substrate W and the polishing surface 311a of the cleaning head 311 from the cleaning nozzle 313, so that particles are removed.

As shown in FIG. 10B, during the back surface cleaning processing for the peripheral portion of the substrate W, the magnet plate 231 is arranged at the lower position, and the magnet plate 232 is arranged at the upper position. In this state, the substrate W is rotated by the spin chuck 210.

In this case, as shown in FIG. 11, each chuck pin 220 is in the closed state in an outer region R1 of the magnet plate 231, and each chuck pin 220 is in the open state in an outer region R2 of the magnet plate 232. That is, the holder 223 of each chuck pin 220 is kept in contact with the outer peripheral end 10 of the substrate W in passing through the outer region R1 of the magnet plate 231 and spaced part from the outer peripheral end 10 of the substrate W in passing through the outer region R2 of the magnet plate 232.

In the present example, at least seven chuck pins 220 among the eight chuck pins 220 are positioned in the outer region R1 of the magnet plate 231. In this case, the substrate W is held by at least the seven chuck pins 220. Thus, stability of the substrate W is ensured. Further, even in the case where the magnet plate 232 is arranged at the upper position, the inclined surfaces 333 of the eight auxiliary pins 330 (FIG. 6B) abut against the bevel portion 1 of the substrate W from above.

In this state, the cleaning head 311 is moved to the peripheral portion of the back surface of the substrate W in the outer region R2. Then, the load P1 is applied to the peripheral portion of the back surface of the substrate W by the polishing surface 311a of the cleaning head 311. Thus, the peripheral portion of the back surface of the substrate W is polished by the cleaning head 311, and foreign matter adhering to the back surface of the substrate W is removed. Further, the cleaning liquid is supplied to a contact portion between the back surface of the substrate W and the polishing surface 311a of the cleaning head 311 from the cleaning nozzle 313, so that particles are removed.

In this manner, during the back surface cleaning processing for the peripheral portion, the holder 223 of each chuck pin 220 is spaced apart from the outer peripheral end 10 of the substrate W in passing through the outer region R1 of the magnet plate 231. Thus, the cleaning head 311 can efficiently and sufficiently clean the peripheral portion of the back surface of the substrate W without interfering with the chuck pin 220.

In the outer region R1, when any chuck pin 220 is spaced apart from the outer peripheral end 10 of the substrate W, the outer peripheral end 10 of the substrate W in the vicinity of the chuck pin 220 is not held by the chuck pin 220. Even in this state, two auxiliary pins 330 adjacent to the chuck pin 220 abut against portions of the bevel portion 1 of the substrate W and generate the reaction force P2 against the load P1 in the substrate W. Therefore, bending of the substrate W in the case where the load P1 is applied by the cleaning head 311 is prevented. Thus, the entire back surface of the substrate W can be sufficiently cleaned while the load P1 applied to the center portion and the peripheral portion of the back surface of the substrate W is uniformly maintained.

After the above-mentioned surface cleaning processing and the back surface cleaning processing, the drying processing for the substrate W is performed. In this case, the magnet plates 231, 232 are arranged at the lower positions, and the substrate W is held by all of the chuck pins 220. In this state, the substrate W is rotated at a high speed by the spin chuck 210. Thus, the cleaning liquid adhering to the substrate W is shaken off, and the substrate W is dried.

During the drying processing for the substrate W, gas such as an inert gas (a nitrogen gas, for example) or air may be supplied to the substrate W through the liquid supply pipe 215. In this case, the cleaning liquid on the substrate W is blown off outward by an air flow formed between the spin plate 213 and the substrate W. Thus, the substrate W can be efficiently dried.

(5) Thermal Processing Section

Figure 12:
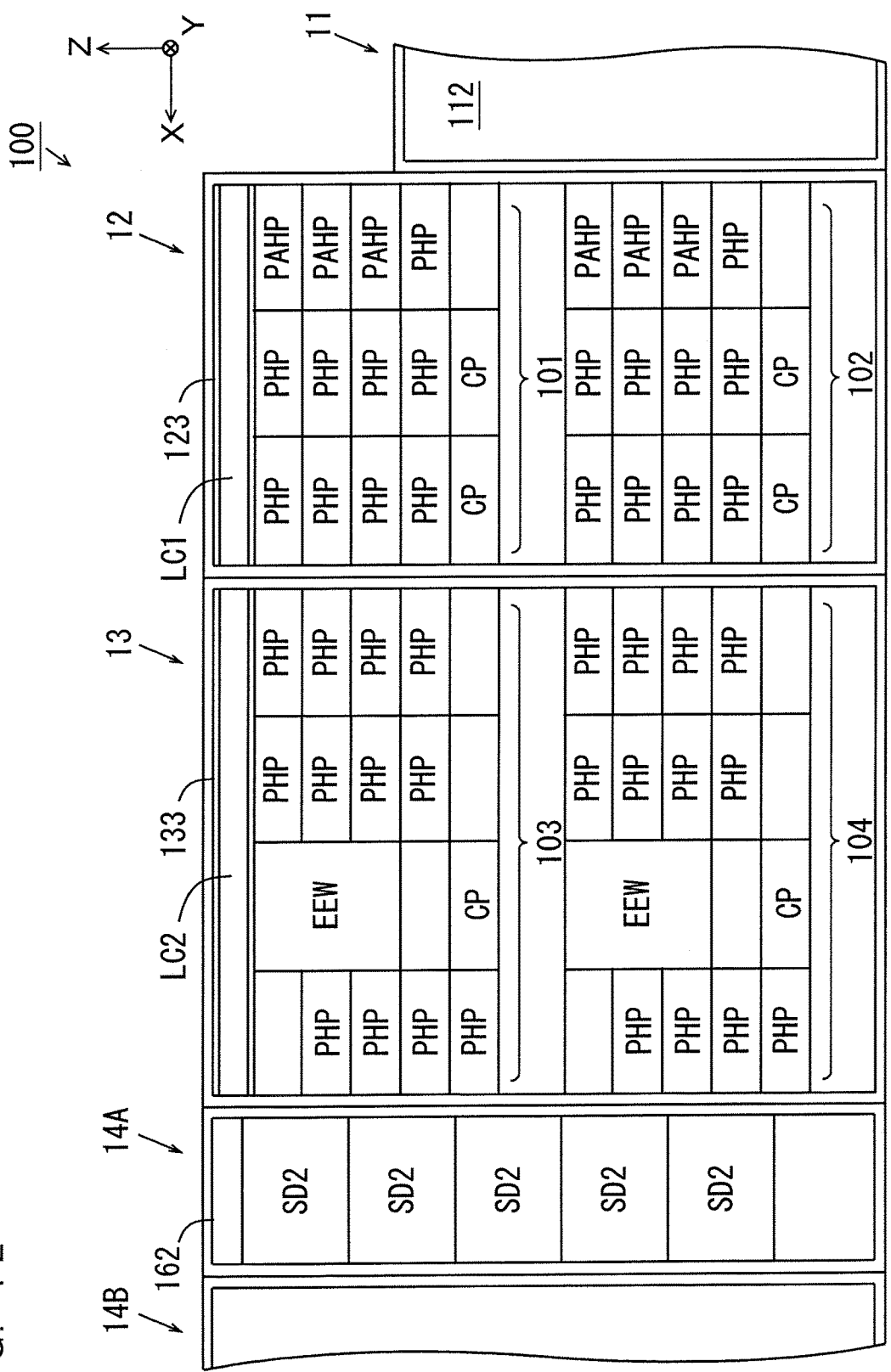
FIG. 12 is a schematic side view showing inner configurations of thermal processing sections and the cleaning drying processing section of FIG. 1.

FIG. 12 is a schematic side view showing the inner configurations of the thermal processing sections 123, 133 and the cleaning drying processing section 162 of FIG. 1. As shown in FIG. 12, the thermal processing section 123 has an upper thermal processing section (an upper thermal processing space) 101 provided above, and a lower thermal processing section (a lower thermal processing space) 102 provided below. A plurality of thermal processing units (thermal processors) PHP, a plurality of adhesion reinforcement processing units (adhesion reinforcement processors) PAHP and a plurality of cooling units (cooling plates) CP are provided in the upper thermal processing section 101 and the lower thermal processing section 102.

A local controller LC1 is provided at the top of the thermal processing section 123. The local controller LC1 controls the operations of the coating processing section 121, the transport section 122 and the thermal processing section 123 based on the instruction from the main controller 114 of FIG. 1.

In each thermal processing unit PHP, heating processing and cooling processing for the substrate W are performed. In each adhesion reinforcement processing unit PAHP, adhesion reinforcement processing for improving the adhesion between the substrate W and the anti-reflection film is performed. Specifically, in the adhesion reinforcement processing unit PAHP, an adhesion reinforcement agent such as HMDS (hexamethyldisilazane) is applied to the substrate W, and the heating processing is performed on the substrate W. In the cooling unit CP, the cooling processing for the substrate W is performed.

The thermal processing section 133 has an upper thermal processing section (an upper thermal processing space) 103 provided above and a lower thermal processing section (a lower thermal processing space) 104 provided below. A cooling unit CP, a plurality of thermal processing units PHP and an edge exposure unit (an edge exposer) EEW are provided in each of the upper thermal processing section 103 and the lower thermal processing section 104. The thermal processing units PHP in the upper thermal processing section 103 and the lower thermal processing section 104 are configured such that the substrates W can be carried in from the cleaning drying processing block 14A.

A local controller LC2 is provided at the top of the thermal processing section 133. The local controller LC2 controls the operations of the development processing section 131, the transport section 132 and the thermal processing section 133 based on the instruction from the main controller 114 of FIG. 1.

In the edge exposure unit EEW, exposure processing for the peripheral portion of the substrate W (edge exposure processing) is performed. Thus, the resist film on the peripheral portion of the substrate W is removed during the subsequent development processing. As a result, after the development processing, in the case where the peripheral portion of the substrate W comes into contact with another member, generation of particles caused by stripping of the resist film on the peripheral portion of the substrate W is prevented.

A plurality (five in this example) of cleaning drying processing units (cleaning drying processors) SD2 are provided in the cleaning drying processing section 162. The cleaning drying processing unit SD2 has the configuration similar to that of the cleaning drying processing unit SD1 except for not having the first cleaning mechanism 310 and having a second cleaning mechanism (a second cleaner) 320 in a first modified example (FIG. 14), described below. In the cleaning drying processing unit SD2, cleaning and drying processing for the substrate W after the exposure processing are performed.

(6) Transport Sections

Figure 13:
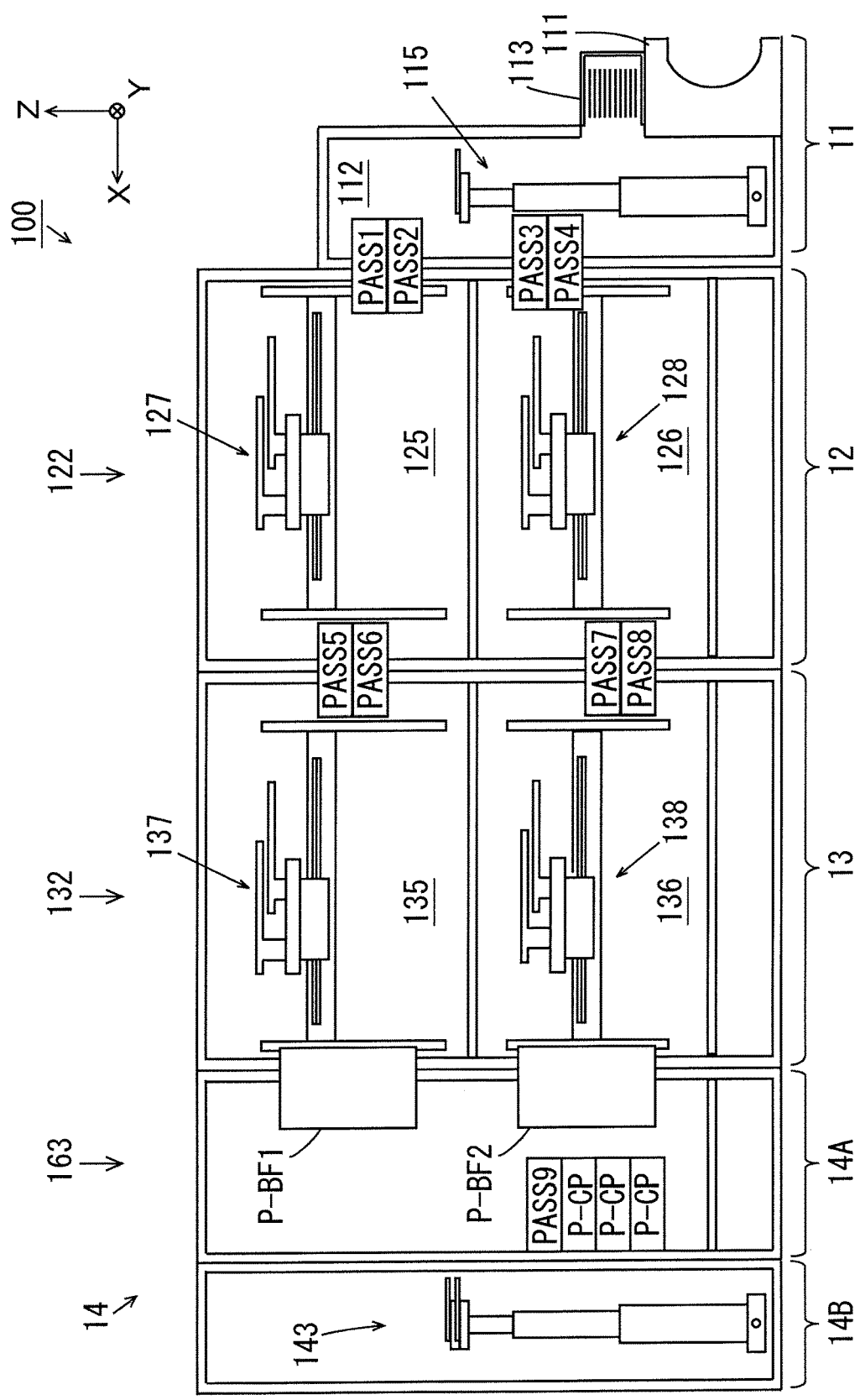
FIG. 13 is a schematic side view showing inner configurations of transport sections.

FIG. 13 is a schematic side view showing the inner configurations of the transport sections 122, 132, 163. As shown in FIG. 13, the transport section 122 has an upper transport chamber 125 and a lower transport chamber 126. The transport section 132 has an upper transport chamber 135 and a lower transport chamber 136. The upper transport chamber 125 is provided with a transport mechanism (a transport robot) 127, and the lower transport chamber 126 is provided with a transport mechanism (a transport robot) 128. Further, the upper transport chamber 135 is provided with a transport mechanism (a transport robot) 137, and the lower transport chamber 136 is provided with a transport mechanism (a transport robot) 138.

The upper thermal processing section 101 (FIG. 12) is opposite to the coating processing chambers 21, 22 (FIG. 2) with the upper transport chamber 125 sandwiched therebetween. The lower thermal processing section 102 (FIG. 12) is opposite to the coating processing chambers 23, 24 (FIG. 2) with the lower transport chamber 126 sandwiched therebetween. The upper thermal processing section 103 (FIG. 12) is opposite to the development processing chambers 31, 32 (FIG. 2) with the upper transport chamber 135 sandwiched therebetween. The lower thermal processing section 104 (FIG. 12) is opposite to the development processing chambers 33, 34 (FIG. 2) with the lower transport chamber 136 sandwiched therebetween.

The substrate platforms PASS1, PASS2 are provided between the transport section 112 and the upper transport chamber 125, and the substrate platforms PASS3, PASS4 are provided between the transport section 112 and the lower transport chamber 126. The substrate platforms PASS5, PASS6 are provided between the upper transport chamber 125 and the upper transport chamber 135, and the substrate platforms PASS7, PASS8 are provided between the lower transport chamber 126 and the lower transport chamber 136.

The placement buffer unit P-BF1 is provided between the upper transport chamber 135 and the transport section 163, and the placement buffer unit P-BF2 is provided between the lower transport chamber 136 and the transport section 163. The substrate platform PASS9 and the plurality of placement cooling units P-CP are provided in the transport section 163 to be adjacent to the carry-in carry-out block 14B.

The placement buffer unit P-BF1 is configured such that the substrates W can be carried in and out by the transport mechanism 137 and the transport mechanisms 141, 142 (FIG. 1). The placement buffer unit P-BF2 is configured such that the substrates W can be carried in and out by the transport mechanism 138 and the transport mechanisms 141, 142 (FIG. 1). Further, the substrate platform PASS9 and the placement cooling units P-CP are configured such that the substrates W can be carried in and out by the transport mechanisms 141, 142 (FIG. 1) and the transport mechanism 143.

The substrates W transported from the indexer block 11 to the coating block 12 are placed on the substrate platform PASS1 and the substrate platform PASS3. The substrates W transported from the coating block 12 to the indexer block 11 are placed on the substrate platform PASS2 and the substrate platform PASS4.

The substrates W transported from the coating block 12 to the development block 13 are placed on the substrate platform PASS5 and the substrate platform PASS7. The substrates W transported from the development block 13 to the coating block 12 are placed on the substrate platform PASS6 and the substrate platform PASS8.

The substrates W transported from the development block 13 to the cleaning drying processing block 14A are placed on the placement buffer units P-BF1, P-BF2. The substrates W transported from the cleaning drying processing block 14A to the carry-in carry-out block 14B are placed on the placement cooling units P-CP. The substrate W transported from the carry-in carry-out block 14B to the cleaning drying processing block 14A is placed on the substrate platform PASS9.

The transport mechanism 127 receives the substrates W from and transfers the substrates W to the coating processing chambers 21, 22 (FIG. 2), the substrate platforms PASS1, PASS2, PASS5, PASS6 (FIG. 13) and the upper thermal processing section 101 (FIG. 12). The transport mechanism 128 receives the substrates W from and transfers the substrates W to the coating processing chambers 23, 24 (FIG. 2), the substrate platforms PASS3, PASS4, PASS7, PASS8 (FIG. 13) and the lower thermal processing section 102 (FIG. 12).

The transport mechanism 137 receives the substrates W from and transfers the substrates W to the development processing chambers 31, 32 (FIG. 2), the substrate platforms PASS5, PASS6 (FIG. 13), the platform buffer unit P-BF1 (FIG. 13) and the upper thermal processing section 103 (FIG. 12). The transport mechanism 138 receives the substrates W from and transfers the substrates W to the development processing chambers 33, 34 (FIG. 2), the substrate platforms PASS7, PASS8 (FIG. 13), the placement buffer unit P-BF2 (FIG. 13) and the lower thermal processing section 104 (FIG. 12).

(7) Substrate Processing

The substrate processing will be described with reference to FIGS. 1, 2, 12 and 13. Each carrier 113 in which unprocessed substrates W are stored (FIG. 1) is placed on each carrier platform 111 (FIG. 1) in the indexer block 11. The transport mechanism 115 (FIG. 1) transports the unprocessed substrate W from the carrier 113 to each of the substrate platforms PASS1, PASS3 (FIG. 13). Further, the transport mechanism 115 transports the processed substrate W that is placed on each of the substrate platforms PASS2, PASS4 (FIG. 13) to the carrier 113.

In the coating block 12, the transport mechanism 127 (FIG. 13) sequentially transports the unprocessed substrate W that is placed on the substrate platform PASS1 to the adhesion reinforcement processing unit PAHP (FIG. 12), the cooling unit CP (FIG. 12) and the coating processing chamber 22 (FIG. 2). Next, the transport mechanism 127 sequentially transports the substrate W in the coating processing chamber 22 to the thermal processing unit PHP (FIG. 12), the cooling unit CP (FIG. 12), the coating processing chamber 21 (FIG. 2), the thermal processing unit PHP (FIG. 12) and the substrate platform PASS5 (FIG. 13).

In this case, the adhesion reinforcement processing is performed on the substrate W in the adhesion reinforcement processing unit PAHP, and then the substrate W is cooled in the cooling unit CP to a temperature suitable for the formation of the anti-reflection film. Next, the anti-reflection film is formed on the substrate W by the coating processing unit 129 (FIG. 2) in the coating processing chamber 22. Subsequently, the thermal processing for the substrate W is performed in the thermal processing unit PHP, and then the substrate W is cooled in the cooling unit CP to a temperature suitable for the formation of the resist film. Then, the resist film is formed on the substrate W by the coating processing unit 129 (FIG. 2) in the coating processing chamber 21. Thereafter, the thermal processing for the substrate W is performed in the thermal processing unit PHP, and the substrate W is placed on the substrate platform PASS5.

Further, the transport mechanism 127 transports the substrate W after the development processing that is placed on the substrate platform PASS6 (FIG. 13) to the substrate platform PASS2 (FIG. 13).

The transport mechanism 128 (FIG. 13) sequentially transports the unprocessed substrate W that is placed on the substrate platform PASS3 to the adhesion reinforcement processing unit PAHP (FIG. 12), the cooling unit CP (FIG. 12) and the coating processing chamber 24 (FIG. 2). Next, the transport mechanism 128 sequentially transports the substrate W in the coating processing chamber 24 to the thermal processing unit PHP (FIG. 12), the cooling unit CP (FIG. 12), the coating processing chamber 23 (FIG. 2), the thermal processing unit PHP (FIG. 12) and the substrate platform PASS? (FIG. 13).

Further, the transport mechanism 128 transports the substrate W after the development processing that is placed on the substrate platform PASS8 (FIG. 13) to the substrate platform PASS4 (FIG. 13). The contents of processing for the substrate W in the coating processing chambers 23, 24 (FIG. 2) and the lower thermal processing section 102 (FIG. 12) are respectively similar to the contents of processing for the substrate W in the above-mentioned coating processing chambers 21, 22 (FIG. 2) and the upper thermal processing section 101 (FIG. 12).

In the development block 13, the transport mechanism 137 (FIG. 13) sequentially transports the substrate W after the formation of the resist film that is placed on the substrate platform PASS5 to the edge exposure unit EEW (FIG. 12) and the placement buffer unit P-BF1 (FIG. 13). In this case, in the edge exposure unit EEW, the edge exposure processing is performed on the substrate W. The substrate W after the edge exposure processing is placed on the placement buffer unit P-BF1.

Further, the transport mechanism 137 takes out the substrate W after the exposure processing and the thermal processing from the thermal processing unit PHP (FIG. 12) adjacent to the cleaning drying processing block 14A. The transport mechanism 137 sequentially transports the substrate W to the cooling unit CP (FIG. 12), one of the development processing chambers 31, 32 (FIG. 2), the thermal processing unit PHP (FIG. 12) and the substrate platform PASS6 (FIG. 13).

In this case, the substrate W is cooled in the cooling unit CP to a temperature suitable for the development processing, and then the development processing for the substrate W is performed by the development processing unit 139 in any one of the development processing chambers 31, 32. Thereafter, the thermal processing for the substrate W is performed in the thermal processing unit PHP, and the substrate W is placed on the substrate platform PASS6.

The transport mechanism 138 (FIG. 13) sequentially transports the substrate W after the formation of the resist film that is placed on the substrate platform PASS7 to the edge exposure unit EEW (FIG. 12) and the placement buffer unit P-BF2 (FIG. 13).

Further, the transport mechanism 138 takes out the substrate W after the exposure processing and the thermal processing from the thermal processing unit PHP (FIG. 12) adjacent to the interface block 14. The transport mechanism 138 sequentially transports the substrate W to the cooling unit CP (FIG. 12), any one of the development processing chambers 33, 34 (FIG. 2), the thermal processing unit PHP (FIG. 12) and the substrate platform PASS8 (FIG. 13). The contents of processing for the substrate W in the development processing chambers 33, 34 and the lower thermal processing section 104 are respectively similar to the contents of processing for the substrate W in the above-mentioned development processing chambers 31, 32 and the upper thermal processing section 103.

In the cleaning drying processing block 14A, the transport mechanism 141 (FIG. 1) sequentially transports the substrate W that is placed on each of the placement buffer units P-BF1, P-BF2 (FIG. 13) to the cleaning drying processing unit SD1 (FIG. 2) and the placement cooling unit P-CP (FIG. 13). In this case, the cleaning and drying processing for the substrate W are performed in the cleaning drying processing unit SD1, and then the substrate W is cooled in the placement cooling unit P-CP to a temperature suitable for the exposure processing by the exposure device 15 (FIG. 1).

The transport mechanism 142 (FIG. 1) sequentially transports the substrate W after the exposure processing that is placed on the substrate platform PASS9 (FIG. 13) to the cleaning drying processing unit SD2 (FIG. 12), and the thermal processing unit PHP (FIG. 12) in the upper thermal processing section 103 or the lower thermal processing section 104. In this case, the cleaning and drying processing for the substrate W are performed in the cleaning drying processing unit SD2, and then the exposure bake (PEB) processing is performed in the thermal processing unit PHP.

In the carry-in carry-out block 14B, the transport mechanism 143 (FIG. 1) transports the substrate W before the exposure processing that is placed on the placement cooling unit P-CP (FIG. 13) to the exposure device 15. Further, the transport mechanism 143 (FIG. 1) takes out the substrate W after the exposure processing from the exposure device 15 and transports the substrate W to the substrate platform PASS9 (FIG. 13).

(8) Effects

In the present embodiment, the load P1 applied to the back surface of the substrate W by the cleaning head 311 during the back surface cleaning processing for the substrate W is resisted by the reaction force P2 generated by the plurality of auxiliary pins 330. Therefore, even when the cleaning head 311 is pressed against the back surface of the substrate W, the substrate W is prevented from bending. Thus, the polishing surface 311a of the cleaning head 311 can uniformly abut against the back surface of the substrate W, and the uniform load P1 can be applied to the back surface of the substrate W for sufficient cleaning. As a result, foreign matter firmly adhering to the back surface of the substrate W, a coating film that is formed when the coating liquid flows to the back surface of the substrate W, foreign matter mixed with the coating film and the like can be reliably removed.

Further, in the present embodiment, because the inclined surface 333 of the auxiliary pin 330 abuts against the bevel portion 1 close to the surface to be processed of the substrate W, it is possible to generate the reaction force P2 against the load P1 applied to the back surface of the substrate W without damaging the resist film R formed on the surface to be processed of the substrate W.

(9) First Modified Example

Figure 14:
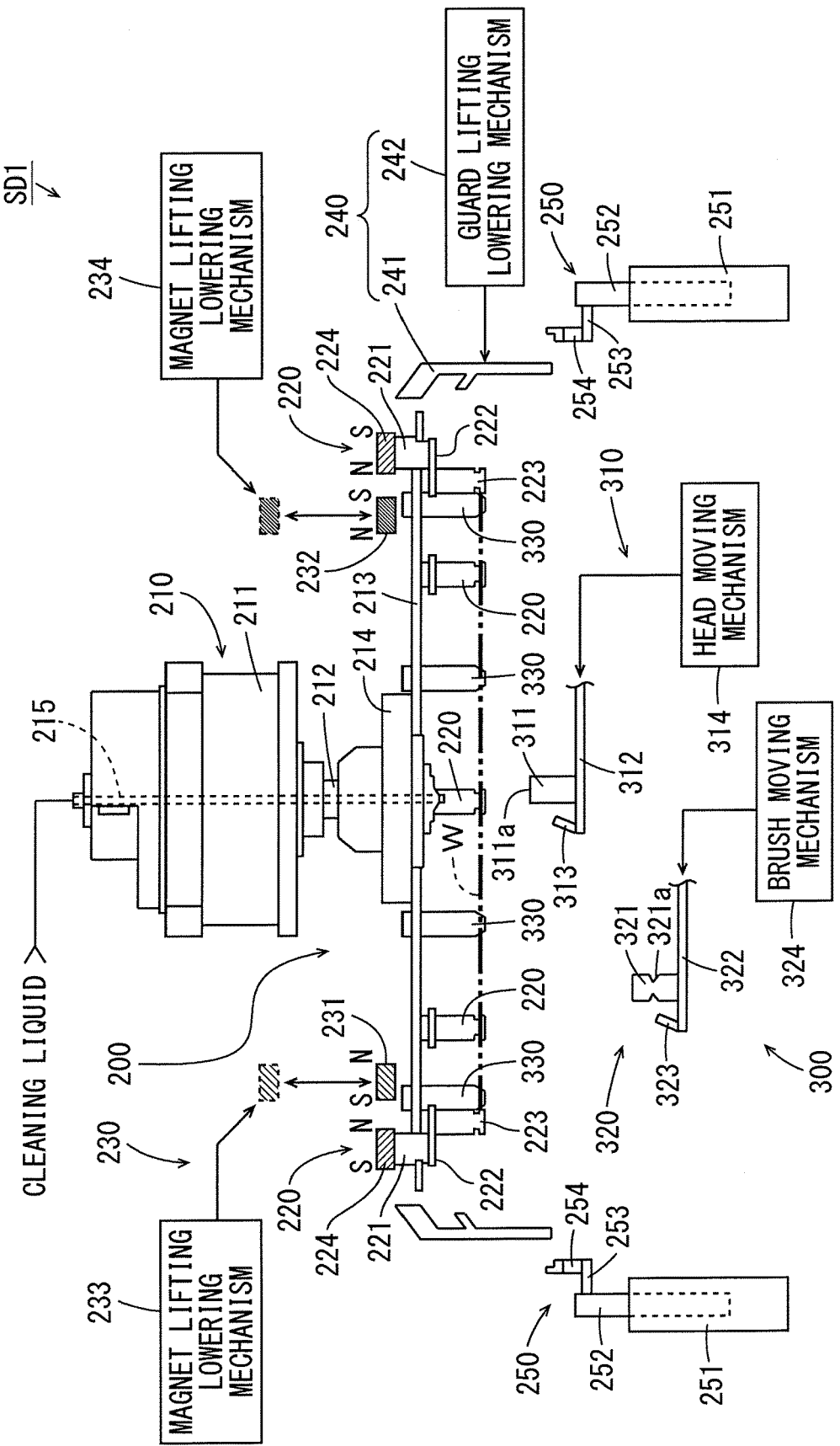
FIG. 14 is a side view showing a configuration of the cleaning drying processing unit in a first modified example.

FIG. 14 is a side view showing a configuration of a cleaning drying processing unit SD1 in the first modified example. The cleaning drying processing unit SD1 in the first modified example has the configuration similar to that of the cleaning drying processing unit SD1 of FIG. 4 except that the cleaning unit 300 further includes the second cleaning mechanism 320 in addition to the first cleaning mechanism 310. As shown in FIG. 14, the second cleaning mechanism 320 includes a cleaning brush 321, a brush holding member (a brush holder) 322, a cleaning nozzle 323 and a brush moving mechanism (a brush mover) 324.

The cleaning brush 321 is substantially columnar and formed of a sponge, for example. The cleaning brush 321 is held by the brush holding member 322. A groove 321a having a V-shaped cross section is formed at an outer peripheral surface of the cleaning brush 321. A liquid supply pipe (not shown) to which a cleaning liquid is supplied is connected to the cleaning nozzle 323. A discharge port of the cleaning nozzle 323 is directed towards surroundings of the upper end of the cleaning brush 321. The brush moving mechanism 324 moves the brush holding member 322. Thus, the cleaning brush 321 is moved in the horizontal and vertical directions.

Figure 15:
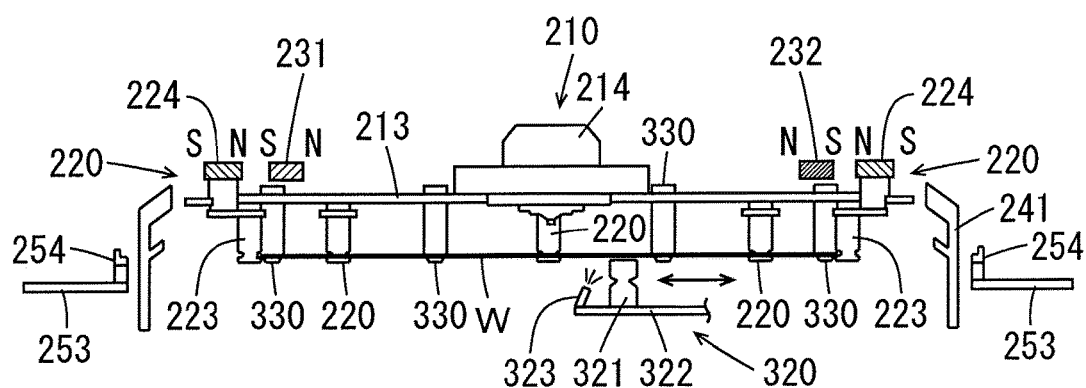
FIG. 15 is a side view for explaining the back surface cleaning processing for the substrate by a second cleaning mechanism.

In the first modified example of the cleaning drying processing unit SD1, back surface cleaning processing by the first cleaning mechanism 310 is performed, and then back surface cleaning processing and outer peripheral end cleaning processing by the second cleaning mechanism 320 are sequentially performed before drying processing. FIG. 15 is a side view for explaining the back surface cleaning processing for the substrate W by the second cleaning mechanism 320.

As shown in FIG. 15, during the back surface cleaning processing for the substrate W, with the substrate W rotated by the spin chuck 210, the cleaning brush 321 is moved to a position directly downward of the substrate W. Then, with the upper surface of the cleaning brush 321 and the back surface of the substrate W in contact with each other, the cleaning brush 321 is moved between the center portion and the peripheral portion of the back surface of the substrate W. The cleaning liquid is supplied to a contact portion between the substrate W and the cleaning brush 321 from the cleaning nozzle 323. Thus, the entire back surface of the substrate W is cleaned by the cleaning brush 321, and contaminants adhering to the back surface of the substrate W are removed.

Figure 16:
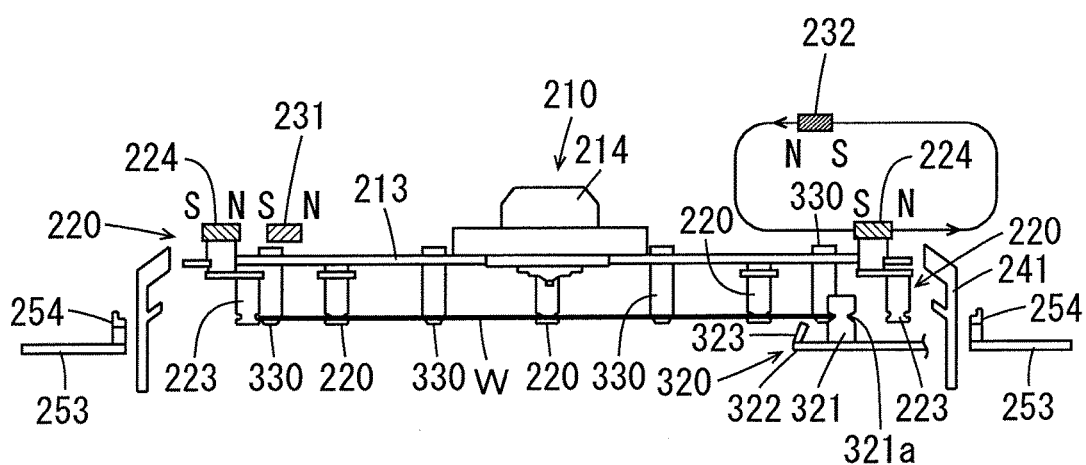
FIG. 16 is a side view for explaining outer peripheral end cleaning processing for the substrate by the second cleaning mechanism.

FIG. 16 is a side view for explaining the outer peripheral end cleaning processing for the substrate W by the second cleaning mechanism 320. As shown in FIG. 16, during the outer peripheral end cleaning processing for the substrate W, the magnet plate 231 is arranged at the lower position, and the magnet plate 232 is arranged at the upper position. In this state, the substrate W is rotated by the spin chuck 210. In this case, similarly to the back surface cleaning processing for the peripheral portion of the substrate W by the first cleaning mechanism 310 in FIG. 10B, each chuck pin 220 is in the closed state in the outer region R1 of the magnet plate 231, and each chuck pin 220 is in the open state in the outer region R2 of the magnet plate 232.

In this state, the cleaning brush 321 is moved to a position between the holder 223 of each chuck pin 220 and the outer peripheral end 10 of the substrate W in the outer region R2. Then, the groove 321a of the cleaning brush 321 is pressed against the outer peripheral end 10 of the substrate W. The cleaning liquid is supplied to a contact portion between the cleaning brush 321 and the substrate W from the cleaning nozzle 323. Thus, the entire outer peripheral end 10 of the substrate W is cleaned, and contaminants adhering to the outer peripheral end 10 of the substrate W are removed.

The back surface cleaning processing for the substrate W by the second cleaning mechanism 320 of FIG. 15 may be continuously performed after the back surface cleaning processing for the center portion of the substrate W by the first cleaning mechanism 310 of FIG. 10A. Further, the outer peripheral end cleaning processing for the substrate W by the second cleaning mechanism 320 of FIG. 16 may be continuously performed after the back surface cleaning processing for the peripheral portion of the substrate W by the first cleaning mechanism 310 of FIG. 10B.

In this manner, in the cleaning drying processing unit SD1 according to the first modified example, the surface, the back surface and the outer peripheral end 10 of the substrate W are cleaned by the first cleaning mechanism 310 and the second cleaning mechanism 320. Thus, different types of foreign matter adhering to the substrate W can be appropriately removed. Further, in this configuration, the cleaning nozzle 313 does not have to be provided in the first cleaning mechanism 310.

While the cleaning unit 300 includes the one first cleaning mechanism 310 in the cleaning drying processing unit SD1 of FIG. 5 or 14, the present invention is not limited to this. The cleaning unit 300 may include a plurality of first cleaning mechanisms 310 having different roughnesses of polishing surfaces 311a of cleaning heads 311. In this case, the substrate W is cleaned by one first cleaning mechanism 310 including a cleaning head 311 with a rough polishing surface 311a, and then the substrate W is cleaned by another first cleaning mechanism 310 including a cleaning head 311 with a fine (smooth) polishing surface 311a. Thus, different types of foreign matter adhering to the substrate W can be more appropriately removed.

While the cleaning unit 300 includes the one second cleaning mechanism 320 in the cleaning drying processing unit SD1 of FIG. 14, the present invention is not limited to this. The cleaning unit 300 may include a plurality of second cleaning mechanisms 320. In this case, the back surface of the substrate W is cleaned by one second cleaning mechanism 320, and the outer peripheral end 10 of the substrate W can be cleaned by another second cleaning mechanism 320. Thus, the back surface cleaning processing and the outer peripheral end cleaning processing can be simultaneously performed.

In the cleaning drying processing unit SD1 of the first modified example, the head moving mechanism 314 and the brush moving mechanism 324 may be realized by a common moving mechanism. Further, as shown in the above-mentioned example, in the case where a plurality of first cleaning mechanisms 310 or a plurality of second cleaning mechanisms 320 are provided in the cleaning unit 300, part of or all of the plurality of head moving mechanisms 314 and the plurality of brush moving mechanisms 324 may be realized by a common moving mechanism.

(10) Second Modified Example

Figure 17:
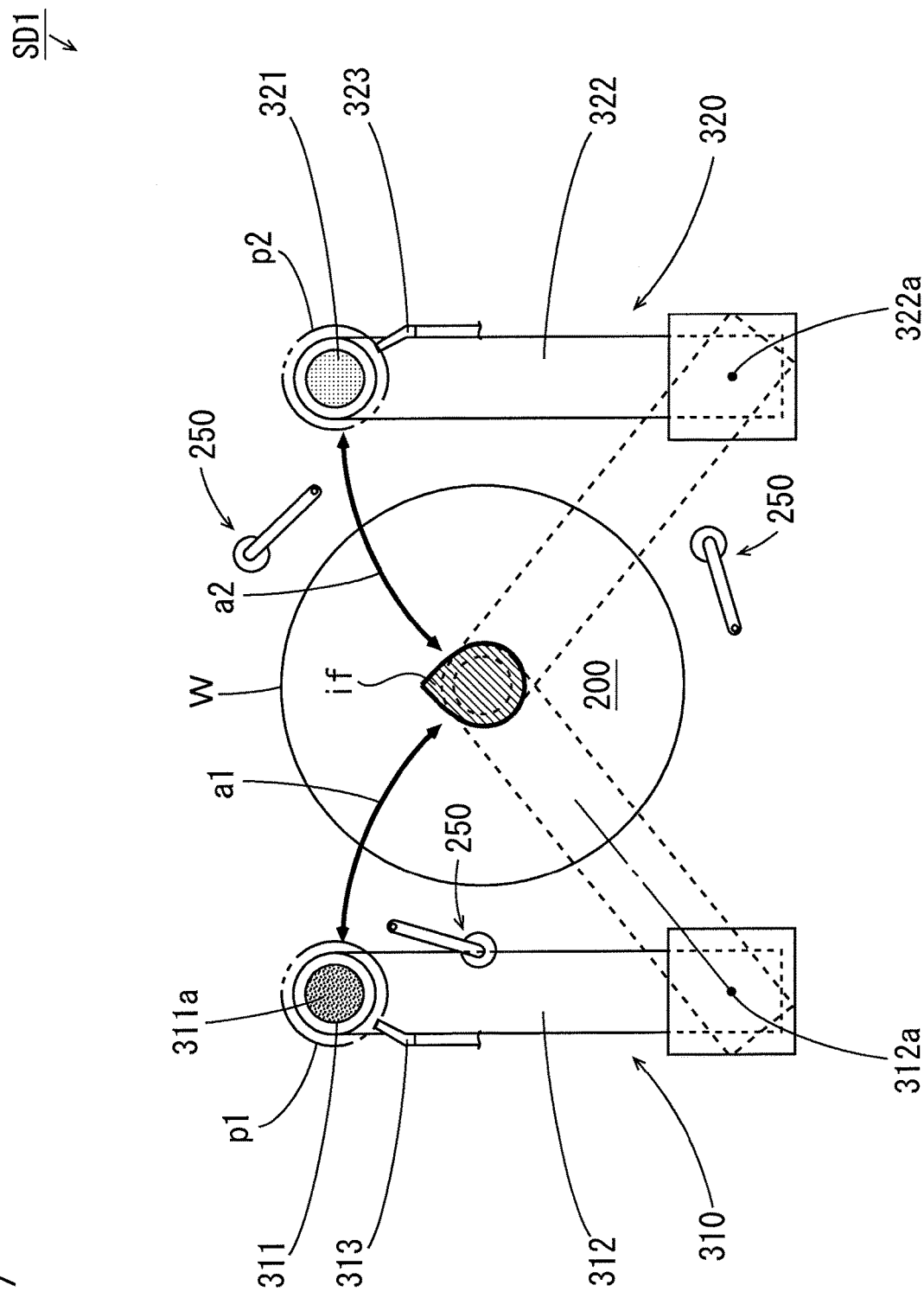
FIG. 17 is a schematic plan view showing a configuration of a cleaning drying processing unit of a second modified example.

In the cleaning drying processing unit SD1 of the first modified example, the back surface cleaning processing by the first cleaning mechanism 310 ends, and then the back surface cleaning processing by the second cleaning mechanism 320 is performed. However, the present invention is not limited to this. The back surface cleaning processing by the second cleaning mechanism 320 may be performed before the back surface cleaning processing by the first cleaning mechanism 310 ends. FIG. 17 is a schematic plan view showing a configuration of the cleaning drying processing unit SD1 of the second modified example. In FIG. 17, the chuck pins 220 and the auxiliary pins 330 are not shown.

As shown in FIG. 17, in the case where not performing the back surface cleaning processing, the first cleaning mechanism 310 waits at a position near one side of the rotation holding unit 200 and below the substrate W while extending in one direction. The cleaning head 311 is attached to one end of the head holding member 312. A position at which the cleaning head 311 is arranged during a period during which the first cleaning mechanism 310 waits is referred to as a head waiting position p1. In FIG. 17, the head waiting position p1 is indicated by a two-dots and dash line.

When the back surface cleaning processing by the first cleaning mechanism 310 is performed, the head holding member 312 is rotated about a center axis 312a at the other end of the head holding member 312. Thus, as indicated by a thick arrow a1 in FIG. 17, at a height lower than the substrate W, the cleaning head 311 is moved between a position opposite to the center of the substrate W held by the spin chuck 200 and the head waiting position p1. Further, the height of the head holding member 312 is adjusted such that the polishing surface 311a of the cleaning head 311 comes into contact with the back surface of the substrate W.

In the case where not performing the back surface cleaning processing, the second cleaning mechanism 320 waits at a position near the other side of the rotation holding unit 200 and below the substrate W while extending in the one direction. The cleaning brush 321 is attached to one end of the brush holding member 322. A position at which the cleaning brush 321 is arranged during a period during which the second cleaning mechanism 320 waits is referred to as a brush waiting position p2. In FIG. 17, the brush waiting position p2 is indicated by a two-dots and dash line.

In the case where the back surface cleaning processing by the cleaning brush 321 is performed, the brush holding member 322 is rotated about a center axis 322a at the other end of the brush holding member 322. Thus, as indicated by a thick arrow a2 in FIG. 17, at a height lower than the substrate W, the cleaning brush 321 is moved between a position opposite to the center of the substrate W held by the spin chuck 200 and the brush waiting position p2. Further, the height of the brush holding member 322 is adjusted such that the upper surface of the cleaning brush 321 comes into contact with the back surface of the substrate W.

In the cleaning drying processing unit SD1, in the case where the head holding member 312 and the brush holding member 322 are simultaneously rotated, a region in which the head holding member 312 and the brush holding member 322 may interfere with each other is defined as an interference region 'if'. The interference region 'if' is an overlap region between a rotational track of the head holding member 312 and a rotational track of the brush holding member 322.

Figure 18A:
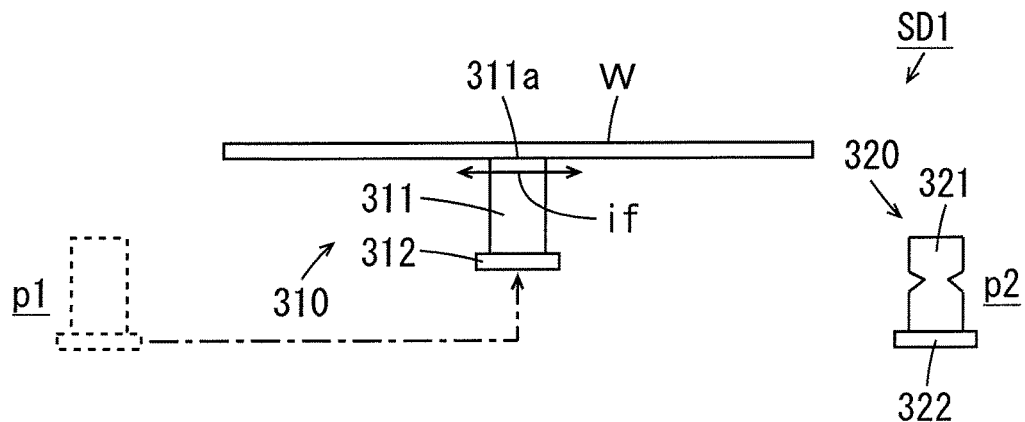
FIGS. 18A to 18C are schematic side views showing an operation of the cleaning drying processing unit of FIG. 17 during the back surface cleaning processing.
Figure 18B:
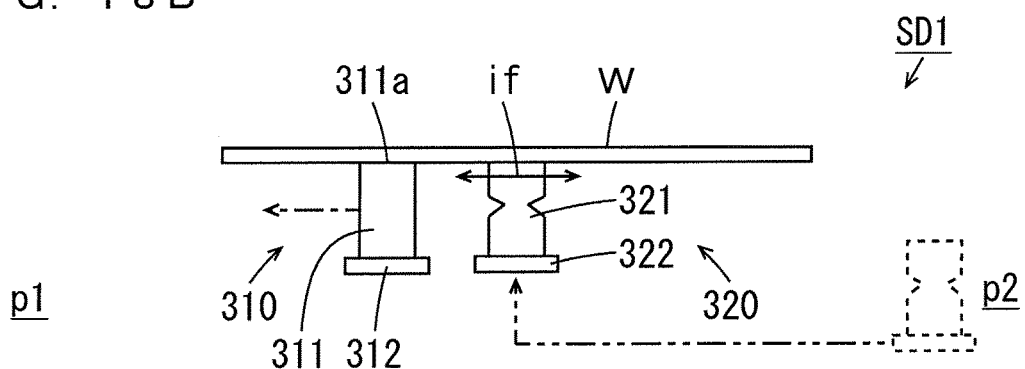
Figure 18C:
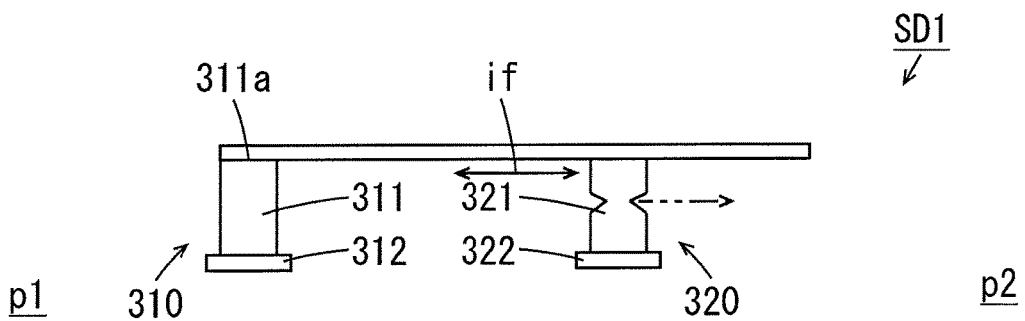

FIGS. 18A to 18C are schematic side views showing an operation of the cleaning drying processing unit SD1 of FIG. 17 during the back surface cleaning processing. In FIGS. 18A to 18C, the rotation holding unit 200 and the auxiliary pins 330 are not shown.

At the time of start of the back surface cleaning processing, the substrate W held by the rotation holding unit 200 of FIG. 17 is rotated at a predetermined speed. Further, the cleaning head 311 of the first cleaning mechanism 310 and the cleaning brush 321 of the second cleaning mechanism 320 are respectively positioned at the head waiting position p1 and the brush waiting position p2 at the height lower than the substrate W.

Next, as indicated by a one-dot and dash arrow in FIG. 18A, the cleaning head 311 is moved to a position directly downward of the center of the substrate W, and then the polishing surface 311a comes into contact with the back surface of the substrate W by lifting of the cleaning head 311. Thus, the center of the back surface of the substrate W is polished by the cleaning head 311.

Thereafter, as indicated by a one-dot and dash arrow in FIG. 18B, the cleaning head 311 is moved to a position on the outer peripheral end of the substrate W. Thus, the back surface of the substrate W is polished from the center towards the outer peripheral end. During the polishing of the substrate W, the cleaning liquid is supplied to the substrate W from the cleaning nozzle 313 of FIG. 17. Therefore, contaminants stripped off from the back surface of the substrate W by the polishing are cleaned away by the cleaning liquid.

As indicated by a two-dots and dash arrow in FIG. 18B, when the head holding member 312 is moved to a position outside of the interference region 'if', the cleaning brush 321 is moved to a position directly downward of the center of the substrate W, and then the upper surface comes into contact with the back surface of the substrate W by lifting of the cleaning brush 321. Thus, the center of the back surface of the substrate W is cleaned by the cleaning brush 321.

Thereafter, as indicated by a two-dots and dash arrow in FIG. 18C, the cleaning brush 321 is moved to a position on the outer peripheral end of the substrate W. Thus, the back surface of the substrate W is cleaned from the center towards the outer peripheral end. During the cleaning of the substrate W, the cleaning liquid is supplied to the substrate W from the cleaning nozzle 323 of FIG. 17. Therefore, contaminants stripped off from the back surface of the substrate W by the polishing are cleaned away by the cleaning liquid.

The back surface cleaning processing for the substrate W ends when the cleaning head 311 and the cleaning brush 321 respectively return to the head waiting position p1 and the brush waiting position p2. This configuration enables the back surface cleaning processing by the first cleaning mechanism 310 and the back surface cleaning processing by the second cleaning mechanism 320 to be simultaneously performed with no interference between the head holding member 312 and the brush holding member 322.

[2] Second Embodiment

Figure 20:
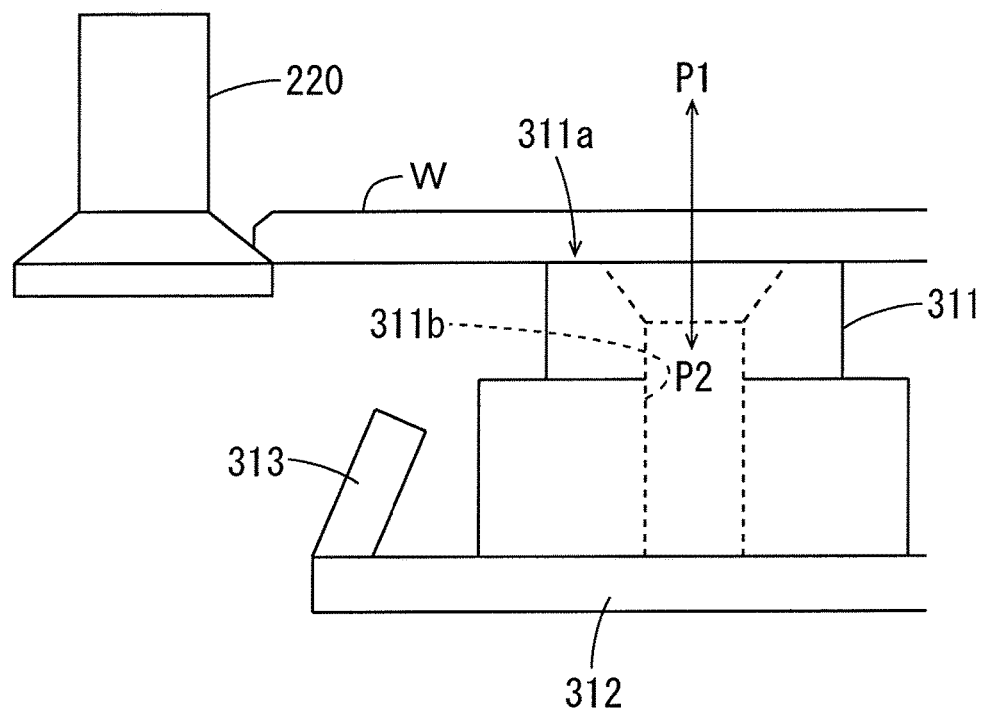
FIG. 20 is an enlarged side view of a cleaning head in the cleaning drying processing unit of FIG. 19.

As for a substrate cleaning device and a substrate processing apparatus according to the second embodiment, differences from the substrate cleaning device and the substrate processing apparatus according to the first embodiment will be described. FIG. 19 is a partial longitudinal cross sectional view showing a configuration of a cleaning drying processing unit SD1 in the second embodiment of the present invention. FIG. 20 is an enlarged side view of a cleaning head 311 in the cleaning drying processing unit SD1 of FIG. 19. As shown in FIG. 19, in the present embodiment, a cleaning unit 300 does not include a plurality of auxiliary pins 330.

Further, in the present embodiment, the shape of a holder 223 of each chuck pin 220 is different from the shape of the holder 223 of each chuck pin 220 of FIG. 4. In the example of FIG. 19, a lower portion of the holder 223 has a truncated cone-shape, and an upper portion of the holder 223 is columnar. A diameter in a horizontal plane of the chuck pin 220 gradually decreases upward in a truncated cone-shaped portion and is constant in a columnar portion. In this case, the substrate W is held by the plurality of holders 223 with the bevel portion 1 (FIG. 6A) not abutting against each holder 223.

An opening 331b penetrating a polishing surface 311a in the vertical direction is formed in a cleaning head 311 of a first cleaning mechanism 310 of FIG. 19. The first cleaning mechanism 310 further includes a suction driving mechanism 315. The suction driving mechanism 315 is an aspirator, for example, and sucks the back surface of the substrate W through the opening 311b of the cleaning head 311. As shown in FIG. 20, during the back surface cleaning processing for the substrate W, the back surface of the substrate W is cleaned by the cleaning head 311 while the substrate W is sucked by the cleaning head 311 from the opening 311b.

In this case, even in the case where the load P1 is applied to any of the center portion and the peripheral portion of the back surface of the substrate W by the polishing surface 311a of the cleaning head 311, the reaction force P2 against the load P1 is generated in the substrate W with the coating film formed on the surface to be processed of the substrate W not damaged by suction. Thus, bending of the substrate W in the case where the load P1 is applied by the cleaning head 311 is prevented. Further, the load P1 can be applied with uniform pressure by the polishing surface 311a of the cleaning head 311 to the entire back surface of the substrate W. As a result, the entire back surface of the substrate W can be uniformly cleaned while the load P1 applied to the center portion and the peripheral portion of the back surface of the substrate W is uniformly maintained.

Further, in the present embodiment, the bevel portion 1 of the substrate W does not come into contact with another member including the chuck pins 220. Therefore, even in the case where the polishing surface 311a of the cleaning head 311 is pressed against the back surface of the substrate W, the back surface of the substrate W can be cleaned with the bevel portion 1 of the substrate W not damaged.

Further, in the present embodiment, foreign matter such as particles generated by the cleaning of the back surface of the substrate W and impurities such as the cleaning liquid used in the cleaning processing for the substrate W can be sucked from the opening 311b to be discharged. Thus, the cleaning head 311 can be easily kept clean. Therefore, the first cleaning mechanism 310 does not have to include the cleaning nozzle 313. Because work for discharging the foreign matter to outside is unnecessary, efficiency of the cleaning can be improved.

[3] Other Embodiments (1) While the cleaning drying processing unit SD1 is provided in the interface block 14 of the substrate processing apparatus 100 in the above-mentioned embodiment, the present invention is not limited to this. The cleaning drying processing unit SD1 may be provided in the coating block 12, the development block 13 or another block of the substrate processing apparatus 100. Alternatively, the cleaning drying processing unit SD1 does not have to be provided in the substrate processing apparatus 100 and may be independently provided as a substrate cleaning device for cleaning the back surface of the substrate W.

Figure 21:
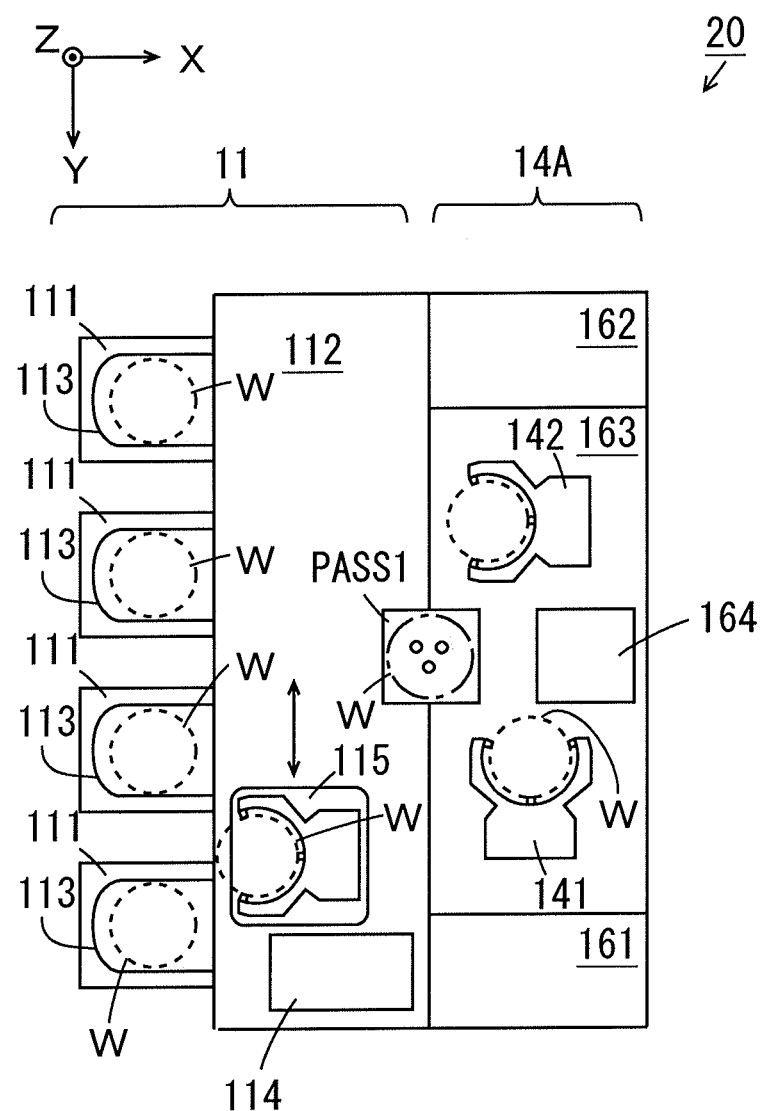
FIG. 21 is a schematic plan view of the substrate cleaning unit including the substrate cleaning device.

FIG. 21 is a schematic plan view of a substrate cleaning unit including a substrate cleaning device. As shown in FIG. 21, the substrate cleaning unit (a substrate cleaner) 20 includes an indexer block 11 and a cleaning drying processing block 14A. The indexer block 11 of FIG. 21 has a configuration similar to that of the indexer block 11 of FIG. 1. Further, the cleaning drying processing block 14A has the configuration similar to that of the cleaning drying processing block 14A of FIG. 1 except for having a buffer unit (a buffer) 164. The cleaning drying processing block 14A of FIG. 21 does not have to have the buffer unit 164 similarly to the cleaning drying processing block 14A of FIG. 1.

The cleaning processing by the substrate cleaning unit 20 will be described. In the indexer block 11, each carrier 113 in which the substrates W to be processed are stored is placed on each carrier platform 111. The transport mechanism 115 transports the substrate W from the carrier 113 to each of the substrate platforms PASS1, PASS3 (FIG. 13). Further, the transport mechanism 115 transports the processed substrate W that is placed on each of the substrate platforms PASS2, PASS4 (FIG. 13) to the carrier 113.

In the cleaning drying processing block 14A, the transport mechanism 141 transports the substrate W placed on each of the substrate platforms PASS1, PASS3 to any cleaning drying processing unit SD1 (FIG. 2) in the cleaning drying processing section 161. In this case, cleaning and drying processing for the substrate W are performed in the cleaning drying processing unit SD1. The transport mechanism 141 transports the substrate W that is cleaned and dried by the cleaning drying processing unit SD1 to each of the substrate platforms PASS2, PASS4.

During the transport of the substrate W from each of the substrate platforms PASS1, PASS3 to the cleaning drying processing section 161, all of the cleaning drying processing units SD1 are sometimes under execution of the cleaning and drying processing for the substrates W. In this case, none of the cleaning drying processing units SD1 can receive the substrate W. Then, in such a case, the transport mechanism 141 transports the substrate W to the buffer unit 164. After any cleaning drying processing unit SD1 becomes able to receive the substrate W, the transport mechanism 141 transports the substrate W in the buffer unit 164 to the cleaning drying processing unit SD1.

The transport mechanism 142 transports the substrate W placed on each of the substrate platforms PASS1, PASS3 to any cleaning drying processing unit SD2 in the cleaning drying processing section 162 (FIG. 12). In this case, the cleaning and drying processing for the substrate W similar to those performed in the cleaning drying processing unit SD1 are performed in the cleaning drying processing unit SD2. The transport mechanism 142 transports the substrate W that is cleaned and dried by the cleaning drying processing unit SD2 to each of the substrate platforms PASS2, PASS4.

During the transport of the substrate W from each of the substrate platforms PASS1, PASS3 to the cleaning drying processing section 162, all of the cleaning drying processing units SD2 are sometimes under execution of the cleaning and drying processing for the substrate W. In this case, none of the cleaning drying processing units SD2 can receive the substrate W. Then, in such a case, the transport mechanism 142 transports the substrate W to the buffer unit 164. After any cleaning drying processing unit SD2 becomes able to receive the substrate W, the transport mechanism 142 transports the substrate W in the buffer unit 164 to the cleaning drying processing unit SD2.

While the four cleaning drying processing units SD1 are provided in the cleaning drying processing section 161 in the example of FIG. 2, the present invention is not limited to this. In the cleaning drying processing section 161, three or less than three cleaning drying processing units SD1 may be provided, or five or more than five cleaning drying processing units SD1 may be provided. While the five cleaning drying processing units SD2 are provided in the cleaning drying processing section 162 in the example of FIG. 12, the present invention is not limited to this. In the cleaning drying processing section 162, four or less than four cleaning drying processing units SD2 may be provided, or six or more than six cleaning drying processing units SD2 may be provided.

(2) While the eight chuck pins 220 are arranged at angular intervals of 45 degrees in the above-mentioned embodiment, the present invention is not limited to this. The number of the chuck pins 220 and the angular intervals at which the chuck pins 220 are arranged may be arbitrarily determined according to the measurement of the substrate W. Similarly, although the eight auxiliary pins 330 are arranged at intervals of 45 degrees in the first embodiment, the present invention is not limited to this. The number of the auxiliary pins 330 and the angular intervals at which the auxiliary pins 330 are arranged may be arbitrarily determined according to the measurement of the substrate W.

(3) While a mechanism for sucking the substrate W is not provided in the first cleaning mechanism 310 in the first embodiment, the present invention is not limited to this. In the first cleaning mechanism 310 of the first embodiment, the suction driving mechanism 315 similar to that of the second embodiment may be provided, and the opening 311b may be formed in the cleaning head 311.

Similarly, although the cleaning unit 300 does not have the plurality of auxiliary pins 330 in the second embodiment, the present invention is not limited to this. The cleaning unit 300 of the second embodiment may have the plurality of auxiliary pins 330 similar to those of the first embodiment.

(4) While the switcher 230 switches the states of the chuck pins 220 between the open state and the closed state by the magnetic force in the above-mentioned embodiment, the present invention is not limited to this. The switcher 230 may switch the states of the chuck pins 220 between the closed state and the open state by a mechanical configuration or electrical control.

(5) In the above-mentioned embodiment, the chuck pins 220 of the cleaning drying processing unit SD1 hold the substrate W below the spin plate 213 such that the back surface of the substrate W is directed downward. However, the present invention is not limited to this. The chuck pins 220 may hold the substrate W above the spin plate 213 such that the back surface of the substrate W is directed upward. In this case, the cleaning unit 300 is arranged in an upper portion of the cleaning drying processing unit SD1, and the back surface of the substrate W is cleaned by a lower surface of the cleaning head 311.

(6) While the exposure device 15 is a dry exposure device in the above-mentioned embodiment, the present invention is not limited to this. The exposure device 15 may be a liquid immersion exposure device, for example. In this case, in the substrate processing apparatus 100, a resist cover film (top-coating) may further be formed on the resist film of the substrate W.

[4] Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the substrate W is an example of a substrate, the peripheral portion PE is an example of a peripheral portion, the outer peripheral end 10 is an example of an outer peripheral end, the bevel portions 1, 2 are respectively examples of a bevel portion closer to a surface to be processed and a bevel portion closer to a back surface, and the end surface 3 is an example of an end surface. The cleaning drying processing unit SD1 is an example of a substrate cleaner, the rotation holding unit 200 is an example of a rotation holder, the cleaning unit 300 is an example of a cleaner, and the rotation shaft 212 is an example of a rotation shaft.

The spin plate 213 is an example of a rotator, the chuck pin 220 is an example of a holder, the cleaning head 311 is an example of a cleaning tool, and the head moving mechanism 314 is an example of a mover. The auxiliary pin 330 is an example of a reaction force generator and an abutment, the inclined surface 333 is an example of an abutment surface, the switcher 230 is an example of a holder switcher, and the outer regions R1, R2 are respectively examples of first and second regions.

The suction driving mechanism 315 is an example of a reaction force generator and a suction, the polishing surface 311a is an example of a polishing surface, the opening 311b is an example of an opening, and the cleaning nozzle 313 is an example of a cleaning liquid supplier. The cleaning brush 321 is an example of a cleaning brush, the processing liquid nozzle 28 is an example of a film former, the edge rinse nozzle 30 is an example of a remover, and the substrate processing apparatus 100 is an example of a substrate processing apparatus.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for cleaning processing for back surfaces of various types of substrates.

I claim:

1. A substrate cleaning device that cleans a back surface of a substrate, comprising:
   a rotation holder that holds and rotates the substrate; and
   a cleaner that cleans the back surface of the substrate held by the rotation holder, wherein
   the rotation holder includes
   a motor having a rotating rotation shaft,
   a rotator provided to be rotatable about a rotation axis by the motor, and
   a plurality of holders provided at the rotator to be capable of abutting against a plurality of portions of an outer peripheral end of the substrate and holding the substrate,
   a rotation center of the substrate coincides with a rotation center of the rotator, and
   the cleaner includes
   a cleaning tool provided to be capable of removing foreign matter on the back surface of the substrate by polishing,
   a mover that moves the cleaning tool while pressing the cleaning tool against the back surface of the substrate held by the plurality of holders, and a reaction force generator that applies a force to the substrate in a direction perpendicular to a surface to be processed or the back surface of the substrate to generate a reaction force in the substrate against a load applied to the back surface of the substrate by the cleaning tool.

2. The substrate cleaning device according to claim 1, wherein
the reaction force generator includes a plurality of abutments provided at the rotator to abut against a plurality of portions of the outer peripheral end of the substrate, and
the plurality of abutments, when a load is applied to the back surface of the substrate by the cleaning tool, generate a reaction force in the outer peripheral end of the substrate against the load.

3. The substrate cleaning device according to claim 2, wherein
the outer peripheral end of the substrate has a bevel portion close to a surface to be processed, a bevel portion close to a back surface and an end surface, and
each of the plurality of abutments has an abutment surface that abuts against a plurality of portions of the bevel portion close to the surface to be processed of the substrate.

4. The substrate cleaning device according to claim 2, wherein
the plurality of holders are provided to be switchable between a substrate holding state and a substrate releasing state,
the substrate holding state being a state where the plurality of holders abut against the plurality of portions of the outer peripheral end of the substrate and hold the substrate and the substrate releasing state being a state where the plurality of holders are spaced apart from the plurality of portions of the outer peripheral end of the substrate,
the rotation holder further includes a holder switcher that switches states of the plurality of holders between the substrate holding state and the substrate releasing state,
each of the plurality of holders passes through a first region and a second region extending along the outer peripheral end of the substrate and is rotated about the rotation axis as the rotator is rotated,
during cleaning of a center region except for a peripheral portion on the back surface of the substrate, the holder switcher brings the plurality of holders into the substrate holding state, and the mover moves the cleaning tool in the center region on the back surface of the substrate, and
during cleaning of the peripheral portion on the back surface of the substrate, the holder switcher brings a holder positioned in the first region among the plurality of holders during the rotation of the rotator into the substrate holding state and brings a holder positioned in the second region among the plurality of holders during the rotation of the rotator into the substrate releasing state, and the mover moves the cleaning tool to a position at the peripheral portion on the back surface of the substrate and in the second region.

5. The substrate cleaning device according to claim 4, wherein
each abutment is arranged between each set of two adjacent holders while abutting against the outer peripheral end of the substrate.

6. The substrate cleaning device according to claim 1, wherein
the reaction force generator includes a suction configured to be capable of sucking the back surface of the substrate, and
the suction, when a load is applied to the back surface of the substrate by the cleaning tool, generates a reaction force against the load by sucking the back surface of the substrate.

7. The substrate cleaning device according to claim 6, wherein
the cleaning tool has a polishing surface facing the back surface of the substrate and an opening in the polishing surface, and
the suction sucks the back surface of the substrate through the opening of the cleaning tool.

8. The substrate cleaning device according to claim 6, wherein
the suction is configured to be capable of discharging foreign matter by sucking the foreign matter removed by the cleaning tool.

9. The substrate cleaning device according to claim 1, wherein
the cleaner further includes a cleaning brush that further cleans the back surface of the substrate, which has been cleaned or is being cleaned by the cleaning tool.

10. The substrate processing device according to claim 1, wherein
the cleaner further includes a cleaning liquid supplier that supplies a cleaning liquid to the back surface of the substrate, which has been cleaned or is being cleaned by the cleaning tool.

11. A substrate processing apparatus comprising:
a film former that forms a coating film on the surface to be processed by supplying a coating liquid to the surface to be processed of a substrate;
a remover that supplies a removal liquid for removing the coating film formed on a peripheral portion of the surface to be processed of the substrate by the film former to the peripheral portion of the substrate; and
the substrate cleaning device according to claim 1 that cleans a back surface of the substrate from which the coating film on the peripheral portion of the surface to be processed is removed by the remover.

* * * * *